US011960667B2

(12) United States Patent
Lee

(10) Patent No.: US 11,960,667 B2
(45) Date of Patent: Apr. 16, 2024

(54) DISPLAY DEVICE AND TOUCH INPUT SYSTEM INCLUDING THE SAME

(71) Applicant: SAMSUNG DISPLAY CO., LTD., Yongin-si (KR)

(72) Inventor: Soon Gyu Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/930,779

(22) Filed: Sep. 9, 2022

(65) Prior Publication Data

US 2023/0251728 A1    Aug. 10, 2023

(30) Foreign Application Priority Data

Feb. 4, 2022    (KR) ........................ 10-2022-0014522

(51) Int. Cl.
*G06F 3/038*    (2013.01)
*G06F 3/0354*    (2013.01)
*G06F 3/042*    (2006.01)

(52) U.S. Cl.
CPC .......... *G06F 3/038* (2013.01); *G06F 3/03545* (2013.01); *G06F 3/0421* (2013.01)

(58) Field of Classification Search
CPC ..... G06F 3/038; G06F 3/03545; G06F 3/0421
USPC ........................................ 345/505, 697, 174
See application file for complete search history.

(56) References Cited

U.S. PATENT DOCUMENTS

2014/0028744 A1* 1/2014 Hashi ................... G09G 3/3406
                                                              345/697
2015/0301651 A1* 10/2015 Leigh .................. G06F 3/04166
                                                              345/174
2018/0157341 A1* 6/2018 Oda ..................... G06F 3/03545
2020/0387265 A1* 12/2020 Yoshida ............... G06F 3/04146
2021/0036047 A1* 2/2021 Heo .................... H01L 27/14652

(Continued)

FOREIGN PATENT DOCUMENTS

KR    10-2005-0019819    3/2005
KR    10-2008-0044838    5/2008
KR    10-2009-0089917    8/2009

(Continued)

OTHER PUBLICATIONS

Dong Yujin et al. Touch display device and touch position detection system Nov. 23, 2018 AU Optronics Corp CN108874220 (A) paragraphs 8-59, figures 1-5. English.*

(Continued)

*Primary Examiner* — Prabodh M Dharia

(74) *Attorney, Agent, or Firm* — F. Chau & Associates, LLC

(57) ABSTRACT

A display device includes a display unit including a plurality of emission areas, a plurality of touch electrodes that sense a touch, a plurality of code patterns formed in a preset code shape on partial areas of front surfaces of the plurality of touch electrodes, a plurality of tilt sensing patterns including a light absorbent disposed in an inner area or a peripheral area of each of the plurality of code patterns, and a main processor. The main processor receives detected image data corresponding to the plurality of tilt sensing patterns from a position input device, and determines arrangement direction information and tilt information of the position input device by comparing the detected image data with each other.

18 Claims, 32 Drawing Sheets

(56) References Cited

U.S. PATENT DOCUMENTS

2021/0065828 A1* 3/2021 Yu ..................... G11C 11/5628
2022/0077431 A1* 3/2022 Lee .................... H10K 59/122

FOREIGN PATENT DOCUMENTS

KR          10-1387005          4/2014
KR       10-2015-0089069        8/2015

OTHER PUBLICATIONS

Dong Yujin et al. Touch display device and touch position detection system Nov. 23, 2018 AU Optronics Corp CN108874220 (A) paragraphs 8-59, figures 1-5. Chinese.*

* cited by examiner

TL: TLa, TLb

DISPLAY DEVICE AND TOUCH INPUT SYSTEM INCLUDING THE SAME

CROSS-REFERENCE TO RELATED APPLICATION

This application claims priority under 35 U.S.C. § 119 to Korean Patent Application No. 10-2022-0014522, filed on Feb. 4, 2022 in the Korean Intellectual Property Office, the disclosure of which is incorporated by reference herein in its entirety.

TECHNICAL FIELD

Embodiments of the present disclosure relate to a display device and a touch input system including the same.

DISCUSSION OF RELATED ART

Various electronic devices such as, for example, smartphones, digital cameras, laptop computers, navigation devices, smart televisions, etc., utilize a display device for displaying images. Such display devices may be flat panel display devices such as, for example, liquid crystal display devices, field emission display devices, or organic light emitting display devices. Among such flat panel display devices, a light emitting display device may display an image without the use of a backlight unit providing light to a display panel, since each of the pixels of the display panel includes its own light emitting element that may emit light.

Some display devices may support a touch input using a portion of a user's body (e.g., a finger) and a touch coordinate input using an electronic pen. The display device may sense the touch input more precisely when using the electronic pen than when using only a portion of the user's body.

SUMMARY

Aspects of the present disclosure provide a display device capable of performing a touch coordinate input of a touch coordinate input device using code patterns of a display panel, and a touch input system including the same.

Aspects the present disclosure also provide a display device capable of recognizing an arrangement direction and a tilt of a position input device using tilt sensing patterns detected together with code patterns, and a touch input system including the same.

According to an embodiment of the present disclosure, a display device includes a display unit including a plurality of emission areas, a plurality of touch electrodes that sense a touch, a plurality of code patterns formed in a preset code shape on partial areas of front surfaces of the plurality of touch electrodes, a plurality of tilt sensing patterns including a light absorbent disposed in an inner area or a peripheral area of each of the plurality of code patterns, and a main processor. The main processor receives detected image data corresponding to the plurality of tilt sensing patterns from a position input device, and determines arrangement direction information and tilt information of the position input device by comparing the detected image data with each other.

In an embodiment, the plurality of tilt sensing patterns are respectively disposed around each of the plurality of code patterns in a horizontal direction (−x-axis direction) of a first side and an upward direction (y-axis direction) of a second side of each of the plurality of code patterns, or are respectively disposed around each of the plurality of code patterns in horizontal directions (x-axis and −x-axis directions) of the first side and an opposing third side and upward and downward directions (y-axis and −y-axis directions) of the second side and an opposing fourth side of each of the plurality of code patterns, in a plan view.

In an embodiment, in a plan view, the plurality of tilt sensing patterns are formed in any one of at least one closed loop shape of a rectangular shape, a square shape, a circular shape, and a rhombic shape, an open loop shape in which the plurality of tilt sensing patterns partially surround at least one of the plurality of emission areas, a mesh shape in which the plurality of tilt sensing patterns surround both portions between and circumferences of the plurality of emission areas, and a linear shape having a preset length.

In an embodiment, the main processor detects light amount detected areas or sensed luminance values corresponding to a plurality of tilt sensing pattern images through the detected image data corresponding to the plurality of tilt sensing patterns. The main processor further generates a comparison result by comparing the light amount detected areas or the sensed luminance values corresponding to the plurality of tilt sensing patterns with each other. The main processor further determines the arrangement direction information and the tilt information of the position input device according to the comparison result.

In an embodiment, the plurality of tilt sensing patterns include a first sensing pattern disposed in a horizontal direction (−x-axis direction) of a first side of each of the plurality of code patterns, a second sensing pattern disposed in an upward direction (y-axis direction) of a second side of each of the plurality of code patterns, a third sensing pattern disposed in a downward direction (−y-axis direction) of a fourth side, which opposes the second side, of each of the plurality of code patterns, and a fourth sensing pattern disposed in a horizontal direction (x-axis direction) of a third side, which opposes the first side, of each of the plurality of code patterns.

In an embodiment, the first to fourth sensing patterns are formed by patterning a light blocking member including the light absorbent, and a content of the light absorbent included in the light blocking member is highest in any one side direction and gradually decreases from the any one side direction to another side direction opposite to the any one side direction.

In an embodiment, the main processor distinguishes a detected image of each of the first to fourth sensing patterns from the detected image data, and corrects a size of the detected image of each of the first to fourth sensing patterns by increasing or decreasing the size according to a distance between the display unit and the position input device.

In an embodiment, the main processor distinguishes a detected image of each of the first to fourth sensing patterns from the detected image data and calculates light amount detected areas sensed differently according to amounts of reflected light from the detected image of each of the first to fourth sensing patterns. The main processor further sets the detected images and the light amount detected areas of the first to fourth sensing patterns detected at a preset reference distance of a front surface of a display panel as reference detected images and reference detected areas.

In an embodiment, when detected images and light amount detected areas of the first to fourth sensing patterns detected at a first time are the same as the reference detected images and the reference detected areas, or are similar to the reference detected images and the reference detected areas within reference error ranges, the main processor determines an arrangement direction of the position input device as a front surface direction and a tilt of the position input device as being substantially perpendicular to the front surface direction.

In an embodiment, the main processor detects one sensing pattern calculated as having a greatest light amount detected area among the first to fourth sensing patterns by comparing the calculated light amount detected areas of the first to fourth sensing patterns with each other. The arrangement direction information of the position input device determined by the main processor corresponds to an arrangement direction of the one sensing pattern calculated as having the greatest light amount detected area.

In an embodiment, the main processor determines that a horizontal tilt of the position input device becomes greater or smaller as an area of the sensing pattern calculated as having the greatest light amount detected area becomes greater or smaller.

In an embodiment, the plurality of sensing patterns are formed by patterning a light blocking member including the light absorbent. The plurality of tilt sensing patterns include a first sensing pattern in which a content of the light absorbent included in the light blocking member is about 25%, a second sensing pattern in which a content of the light absorbent included in the light blocking member is about 50%, a third sensing pattern in which a content of the light absorbent included in the light blocking member is about 75%, and a fourth sensing pattern in which a content of the light absorbent included in the light blocking member is about 100%.

In an embodiment, the plurality of tilt sensing patterns further include a fifth sensing pattern in which a content of the light absorbent included in the light blocking member is about 25%, a sixth sensing pattern in which a content of the light absorbent included in the light blocking member is about 50%, a seventh sensing pattern in which a content of the light absorbent included in the light blocking member is about 75%, and an eighth sensing pattern in which a content of the light absorbent included in the light blocking member is about 100%.

In an embodiment, the main processor detects luminance detected images and first to fourth luminance values of the first to fourth sensing patterns from the detected image data detected in a front surface direction, and sets the luminance detected images and the first to fourth luminance values of the first to fourth sensing patterns detected in the front surface direction as reference luminance detected images and first to fourth reference luminance values.

In an embodiment, when the first to fourth luminance values of the first to fourth sensing patterns detected at a first time are the same as the first to fourth reference luminance values or similar to the first to fourth reference luminance values within reference error ranges, the main processor determines an arrangement direction of the position input device as a front surface direction and a tilt of the position input device as being substantially perpendicular to the front surface direction.

In an embodiment, the main processor detects the first to fourth luminance values from the luminance detected images of the first to fourth sensing patterns detected at a first time. The main processor further detects one sensing pattern as having a highest luminance value among the first to fourth luminance values by comparing the first to fourth luminance values with the first to fourth reference luminance values, respectively. The main processor further determines an arrangement direction of the position input device so as to correspond to an arrangement direction of the one sensing pattern detected as having the highest luminance value.

In an embodiment, the main processor determines that a horizontal tilt of the position input device becomes greater or smaller as a difference value between any one of the first to fourth reference luminance values and a highest luminance value among the first to fourth luminance values becomes greater or smaller.

According to an embodiment of the present disclosure, a touch input system includes a display device that displays an image, and a position input device that inputs touch coordinates to the display device. The display device includes a display unit including a plurality of emission areas, a plurality of touch electrodes that sense a touch, a plurality of code patterns formed in a preset code shape on partial areas of front surfaces of the plurality of touch electrodes, and a plurality of tilt sensing patterns including a light absorbent disposed in an inner area or a peripheral area of each of the plurality of code patterns. The position input device includes a code processor that generates detected image data corresponding to the plurality of tilt sensing patterns, and generates arrangement direction information of the position input device and tilt information of the position input device by comparing the detected image data corresponding to the plurality of tilt sensing patterns with each other.

In an embodiment, the plurality of sensing patterns are formed by patterning a light blocking member including the light absorbent. The plurality of tilt sensing patterns include a first sensing pattern in which a content of the light absorbent included in the light blocking member is about 25%, a second sensing pattern in which a content of the light absorbent included in the light blocking member is about 50%, a third sensing pattern in which a content of the light absorbent included in the light blocking member is about 75%, and a fourth sensing pattern in which a content of the light absorbent included in the light blocking member is about 100%.

In an embodiment, the code processor detects light amount detected areas or sensed luminance values corresponding to the plurality of tilt sensing pattern images through the detected image data corresponding to the plurality of tilt sensing patterns. The code processor further generates a comparison result by comparing the light amount detected areas or the sensed luminance values corresponding to the plurality of tilt sensing patterns with each other. The code processor further determines the arrangement direction information and the tilt information of the position input device according to the comparison result.

With the display device and the touch input system including the same according to embodiments of the present disclosure, touch coordinate data of the position input device may be generated without complicated calculation and correction operations, and a touch coordinate input of the position input device may be performed, using code patterns of a display panel. For example, a touch input function having accurate input coordinates may be performed, cost and power consumption may be reduced, and a driving process may be simplified.

In addition, with the display device and the touch input system including the same according to embodiments of the present disclosure, the arrangement direction and the tilt of the position input device may be recognized using the tilt sensing pattern images detected by the position input device. Accordingly, a structure of the position input device may be simplified so that a separate tilt sensor or a gyro sensor is not provided, and accordingly, power consumption may be reduced.

The effects of embodiments of the present disclosure are not limited to the aforementioned effects.

BRIEF DESCRIPTION OF THE DRAWINGS

The above and other aspects and features of the present disclosure will become more apparent by describing in detail embodiments thereof with reference to the accompanying drawings, in which.

DETAILED DESCRIPTION OF THE EMBODIMENTS

Figure 1:
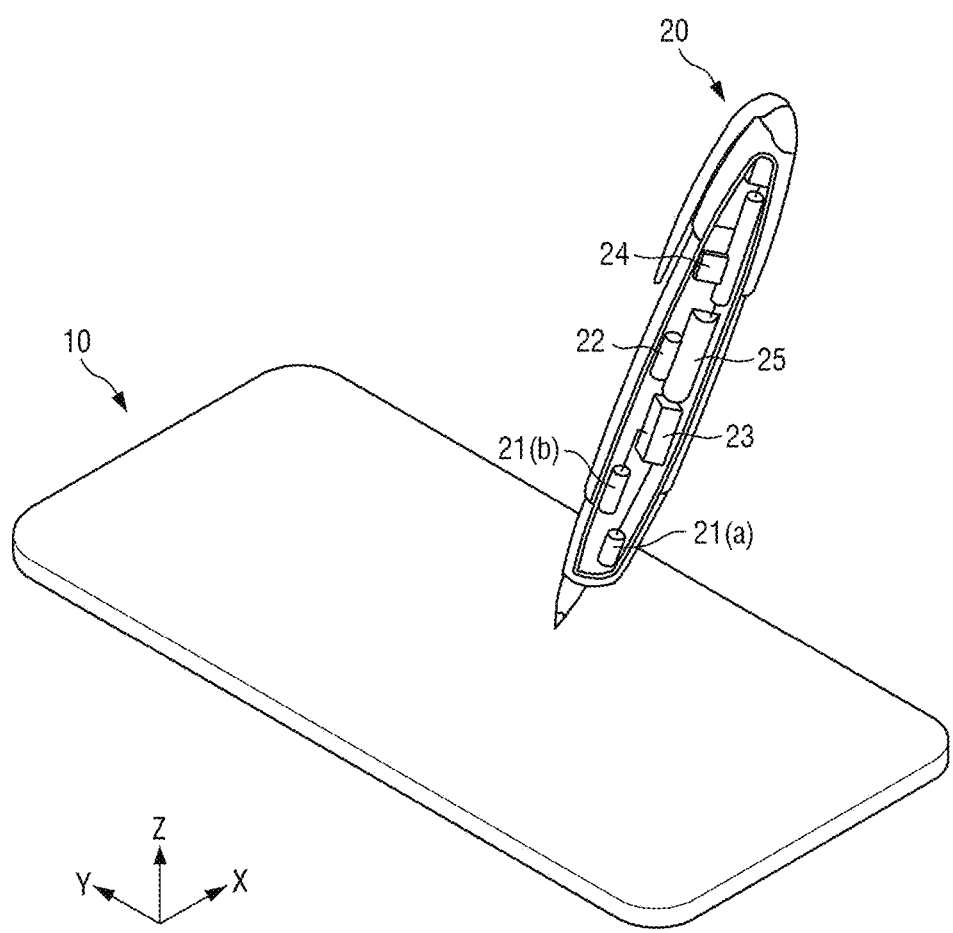
FIG. 1 is a view illustrating a configuration of a touch input system according to an embodiment of the present disclosure.

Exemplary embodiments of the present disclosure will be described more fully hereinafter with reference to the accompanying drawings. Like reference numerals may refer to like elements throughout the accompanying drawings.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

It will be understood that the terms "first," "second," "third," etc. are used herein to distinguish one element from another, and the elements are not limited by these terms. Thus, a "first" element in an embodiment may be described as a "second" element in another embodiment.

Each of the features of the various embodiments of the present disclosure may be combined or combined with each other, in part or in whole, and technically various interlocking and driving are possible. Each embodiment may be implemented independently of each other or may be implemented together in an association.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of these terms and similar terms to describe the relationships between components should be interpreted in a like fashion.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

Figure 2:
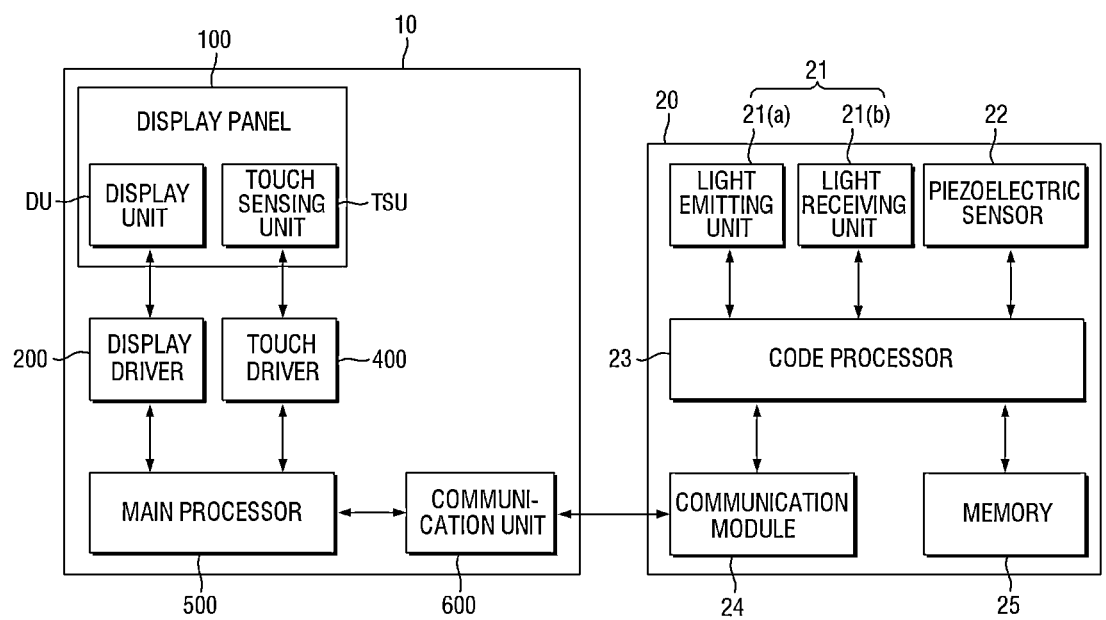
FIG. 2 is a block diagram illustrating a position input device and a display device illustrated in FIG. 1 according to an embodiment of the present disclosure.

FIG. 1 is a view illustrating a configuration of a touch input system according to an embodiment of the present disclosure. FIG. 2 is a block diagram illustrating a position input device and a display device illustrated in FIG. 1 according to an embodiment of the present disclosure.

Referring to FIGS. 1 and 2, a display device 10 may be applied to portable electronic devices such as, for example, mobile phones, smartphones, tablet personal computers (PCs), mobile communication terminals, electronic notebooks, electronic books, portable multimedia players (PMPs), navigation devices, and ultra-mobile PCs (UMPCs). As an example, the display device 10 may be applied as a display unit of televisions, laptop computers, monitors, billboards, or Internet of Things (IOT) devices. As another example, the display device 10 may be applied to wearable devices such as smartwatches, watch phones, glasses-type displays, and head mounted displays (HMDs).

The display device 10 includes a display panel 100, a display driver 200, a touch driver 400, a main processor 500, and a communication unit 600. In addition, a position input device 20 includes a code detection unit 21, a piezoelectric sensor 22, a code processor 23, a communication module 24, and a memory 25.

The display device 10 uses the position input device 20 as a touch input mechanism. The display panel 100 of the display device 10 may include a display unit DU displaying an image and a touch sensing unit TSU sensing a human body part such as, for example, a finger, the position input device 20, etc.

The display unit DU of the display panel 100 may include a plurality of pixels and display the image through the plurality of pixels. The touch sensing unit TSU of the display panel 100 may be formed on a front surface portion of the display panel 100. The touch sensing unit TSU may include a plurality of touch electrodes that sense a user's touch in a capacitive manner. Here, code patterns and tilt sensing patterns are formed on some of the plurality of touch electrodes, and are detected by the position input device 20.

For example, code patterns having a planar code shape are formed and disposed at preset intervals on portions of front surfaces of some of the plurality of touch electrodes. The code patterns of the display panel 100 are formed of light blocking members covering some of the plurality of touch electrodes with a predetermined area to form preset planar code shapes. The code patterns are sensed by the position input device 20 according to, for example, the planar code shapes of the light blocking members, sizes of planar codes, etc.

Tilt sensing patterns used to detect an arrangement direction and a tilt of the position input device 20 are formed on front surfaces of some of the other touch electrodes, which are peripheral areas of the touch electrodes on which the code patterns are formed. That is, the tilt sensing patterns are formed on the peripheral touch electrodes of the touch electrodes on which the code patterns are formed, except for front surface areas of some of the touch electrodes on which the code patterns are formed. The tilt sensing patterns may be formed of the light blocking members simultaneously with the code patterns or may be formed separately from the code patterns.

The tilt sensing patterns may be formed of the same material as the light blocking members forming the code patterns. However, a content of an infrared light absorbent (hereinafter, referred to as an absorbent) included in light blocking members forming the tilt sensing patterns may be set to be different from that in the light blocking members forming the code patterns. As an example, each of the light blocking members forming the tilt sensing patterns may include a coating member made of an organic material or an inorganic material and an absorbent included in the coating member. Here, the content of the absorbent in the light blocking member may be a ratio of a weight of the absorbent to a weight of the coating member.

The tilt sensing patterns formed to include the absorbent partially absorb and reflect infrared light from the position input device 20, and the position input device 20 generates detected image data of the infrared light reflected through the tilt sensing patterns.

In embodiments, the code patterns and the tilt sensing patterns are not directly formed on the front surfaces of the touch patterns, and may also be formed on a separate transparent film and be disposed on a front surface of the touch sensing unit TSU together with the transparent film. In this case, the code patterns and the tilt sensing patterns may correspond to arrangement positions of touch electrodes on the transparent film. Formation structures of the code patterns and the tilt sensing patterns disposed on an upper portion or the front surface of the touch sensing unit TSU may be applied in various structures, and are not limited to any one embodiment. However, an example in which the code patterns and the tilt sensing patterns are directly formed on partial areas of the front surfaces of the touch patterns will hereinafter be described, and detailed formation structures of the code patterns and the tilt sensing patterns will be described in more detail below with reference to the accompanying drawings.

The display driver 200 may output signals and voltages for driving the display unit DU. The display driver 200 may supply data voltages to data lines. The display driver 200 may supply a source voltage to power lines and supply gate control signals to a gate driver.

The touch driver 400 may be connected to the touch sensing unit TSU. The touch driver 400 may supply touch driving signals to the plurality of touch electrodes of the touch sensing unit TSU and sense change amounts in capacitance between the plurality of touch electrodes. The touch driver 400 may determine whether a user's touch input has been performed and calculate touch coordinates, based on the change amounts in capacitance between the plurality of touch electrodes.

The main processor 500 may control all functions of the display device 10. For example, the main processor 500 may supply digital video data to the display driver 200, allowing the display panel 100 to display the image. As an example, the main processor 500 may receive touch data from the touch driver 400 to determine the touch coordinates of a user's touch input, and then generate digital video data according to the touch coordinates or execute an application indicated by an icon displayed at a location corresponding to the touch coordinates. As another example, the main processor 500 may receive coordinate data from the position input device 20 to determine touch coordinates of the position input device 20, and then generate digital video data according to the touch coordinates or execute an application indicated by an icon displayed at a location corresponding to the touch coordinates of the position input device 20.

In addition, the main processor 500 receives detected image data corresponding to the tilt sensing patterns together with the coordinate data from the position input device 20. In addition, the main processor 500 may analyze the detected image data corresponding to the tilt sensing patterns to determine arrangement direction and tilt information of the position input device 20, and generate digital video data according to the arrangement direction and tilt information of the position input device 20 or execute an application corresponding to the arrangement direction and tilt information. A method of calculating the arrangement direction and the tilt of the position input device 20 using tilt sensing pattern detected images will be described in more detail below.

The communication unit 600 may perform wired/wireless communication with an external device. For example, the communication unit 600 may transmit and receive communication signals to and from the communication module 24 of the position input device 20. The communication unit 600 may receive coordinate data including data codes from the position input device 20, and may provide the coordinate data to the main processor 500.

The position input device 20 may be used as a touch input mechanism, and may be configured as an electronic pen such as, for example, a smart pen. The position input device 20 may be an electronic pen sensing display light of the display panel 100 or light reflected from the display panel 100 using an optical method, and may detect the code patterns and the tilt sensing patterns included in the display panel 100 based on the sensed light and generate coordinate data. Such a position input device 20 may be an electronic pen having a writing instrument shape, but is not limited to a specific writing instrument shape or structure.

The code detection unit 21 of the position input device 20 is disposed at a position adjacent to a nib part of the position input device 20, and senses the code patterns and the tilt sensing patterns included in the display panel 100. To this end, the code detection unit 21 includes at least one light emitting unit 21(a) emitting infrared light using at least one infrared light source, and at least one light receiving unit 21(b) detecting infrared light reflected from the code patterns and the tilt sensing patterns with an infrared camera.

At least one infrared light source included in the light emitting unit 21(a) may be configured as an infrared light emitting diode (LED) array having a matrix structure. In addition, the infrared camera of the light receiving unit 21(b) may include a filter cutting off wavelength bands other than infrared light and passing infrared light therethrough, a lens system focusing the infrared light passing through the filter, an optical image sensor converting an optical image formed by the lens system into an electrical image signal and outputting the electrical image signal, etc. The optical image sensor may be configured as an array having a matrix structure like the infrared LED array, and may provide shape data of the code patterns and the tilt sensing patterns to the code processor 23 according to forms of infrared light reflected from the code patterns and the tilt sensing patterns. As such, the code detection unit 21 of the position input device 20 may continuously detect the code patterns and the tilt sensing patterns according to user's control and movement, continuously generate the shape data of the code patterns and the tilt sensing patterns, and provide the shape data of the code patterns and the tilt sensing patterns to the code processor 23.

The code processor 23 may continuously receive the shape data of the code patterns and the tilt sensing patterns from the code detection unit 21. The code processor 23 continuously receives the shape data of the code patterns and the tilt sensing patterns, and identifies each of arrangement structures and shapes of the code patterns and the tilt sensing patterns.

For example, the code processor 23 separately identifies and extracts data codes corresponding to the arrangement structure and the shape of the code patterns from the shape data of the code patterns and the tilt sensing patterns, combines the extracted data codes with each other, and extracts or generates coordinate data corresponding to the combined data codes. In addition, the code processor 23 transmits the generated coordinate data to the display device 10 through the communication module 24. For example, the code processor 23 may generate and convert data codes for a code shape identified with the code patterns to quickly generate coordinate data without performing complicated calculation and correction operations.

In addition, the code processor 23 identifies and detects image data corresponding to shapes of the tilt sensing patterns separately from the code patterns from the shape data of the code patterns and the tilt sensing patterns. In addition, the code processor 23 may transmit the detected image data corresponding to the tilt sensing patterns to the display device 10 through the communication module 24. The display device 10 may analyze the detected image data corresponding to the tilt sensing patterns to detect the arrangement direction and tilt information of the position input device 20.

In embodiments, the code processor 23 may directly analyze the detected image data corresponding to the tilt sensing patterns to determine arrangement direction and tilt information of the position input device 20 itself. In addition, the code processor 23 may transmit the arrangement direction and tilt information detected and determined by itself to the display device 10 through the communication module 24. Hereinafter, an embodiment in which the main processor 500 of the display device 10 detects arrangement direction information and tilt information of the position input device 20 will be described. However, embodiments are not limited thereto. For example, in embodiments, the code processor 23 of the position input device 20 may also detect arrangement direction information and tilt information of the position input device 20 by the same method as the main processor 500. Accordingly, a component that detects the arrangement direction information and the tilt information of the position input device 20 is not limited to any one of the main processor 500 of the display device 10 or the code processor 23 of the position input device 20. As described above, a method of calculating the arrangement direction and the tilt of the position input device 20 using tilt sensing pattern detected images will be described in more detail below.

The communication module 24 may perform wired/wireless communication with an external device. For example, the communication module 24 may transmit and receive communication signals to and from the communication unit 600 of the display device 10. The communication module 24 may receive the coordinate data including the data codes from the code processor 23, and may provide the coordinate data to the communication unit 600.

The memory 25 may store data utilized for driving the position input device 20. The memory 25 stores shape data of the code patterns and data codes each corresponding to the respective shape data and code patterns. In addition, the memory 25 stores data codes and coordinate data according to a combination of data codes. The memory 25 shares data codes each corresponding to the respective shape data and code patterns, and coordinate data according to a combination of data codes with the code processor 23. Accordingly, the code processor 23 may combine the data codes with each other through the data codes and the coordinate data stored in the memory 25, and may extract or generate coordinate data corresponding to the combined data codes.

Figure 3:
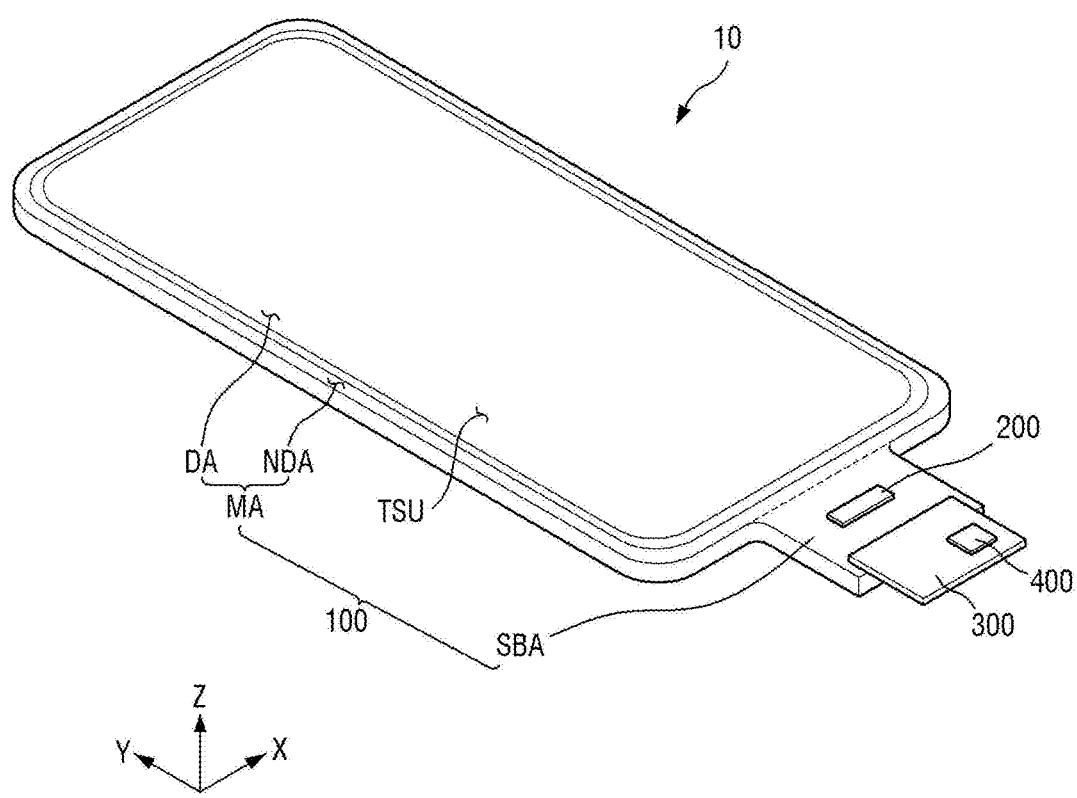
FIG. 3 is a perspective view illustrating a configuration of the display device illustrated in FIG. 2 according to an embodiment of the present disclosure.
Figure 4:
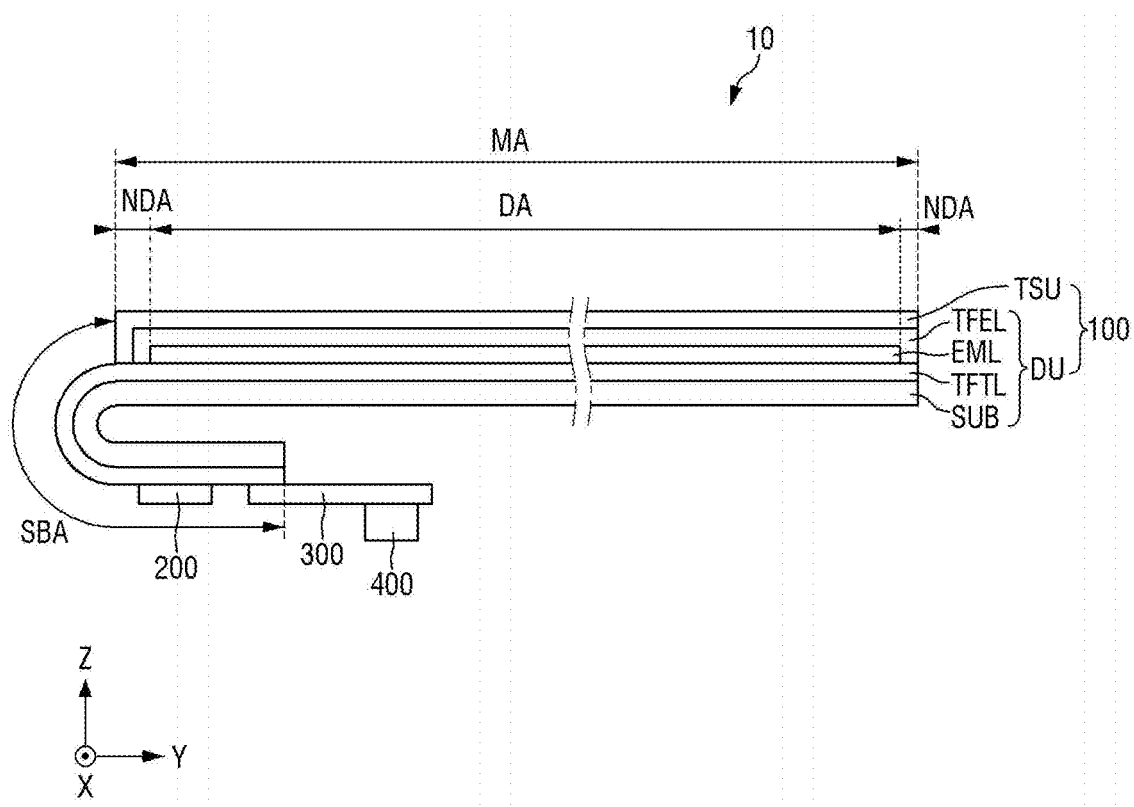
FIG. 4 is a cross-sectional view illustrating the configuration of the display device illustrated in FIG. 2 according to an embodiment of the present disclosure.

FIG. 3 is a perspective view illustrating a configuration of the display device illustrated in FIG. 2 according to an embodiment of the present disclosure. FIG. 4 is a cross-sectional view illustrating the configuration of the display device illustrated in FIG. 2 according to an embodiment of the present disclosure.

Referring to FIGS. 3 and 4, the display device 10 may have a shape similar to a rectangular shape, in a plan view. For example, the display device 10 may have a shape similar to a rectangular shape, in a plan view, having short sides in an X-axis direction and long sides in a Y-axis direction. A corner where the short side in the X-axis direction and long sides in the Y-axis direction meet may be rounded with a predetermined curvature or may be right-angled. The shape of the display device 10 in a plan view is not limited to the rectangular shape, and may be a shape similar to, for example, a polygonal shape, a circular shape, or an elliptical shape.

The display panel 100 may include a main area MA and a sub-area SBA.

The main area MA may include a display area DA including pixels displaying an image, and a non-display area NDA disposed around the display area DA in which the image is not displayed. The display area DA may emit light from a plurality of emission areas or a plurality of opening areas. For example, the display panel 100 may include pixel circuits including switching elements, a pixel defining layer defining the emission areas or the opening areas, and self-light emitting elements.

The non-display area NDA may be an area disposed outside the display area DA. The non-display area NDA may be defined as an edge area of the main area MA of the display panel 100. The non-display area NDA may include a gate driver supplying gate signals to gate lines, and fan-out lines connecting the display driver 200 and the display area DA to each other.

The sub-area SBA may extend from one side of the main area MA. The sub-area SBA may include a flexible material that may be bent, folded, and rolled. For example, when the sub-area SBA is bent, the sub-area SBA may overlap the main area MA in a thickness direction (Z-axis direction). The sub-area SBA may include the display driver 200 and pad parts connected to a circuit board 300. In embodiments, the sub-area SBA may be omitted, and the display driver 200 and the pad parts may be disposed in the non-display area NDA.

The display driver 200 may be formed as an integrated circuit (IC) and be mounted on the display panel 100 in, for example, a chip on glass (COG) manner, a chip on plastic (COP) manner, or an ultrasonic bonding manner. As an example, the display driver 200 may be disposed in the sub-area SBA, and may overlap the main area MA in the thickness direction (Z-axis direction) by bending of the sub-area SBA. As another example, the display driver 200 may be mounted on the circuit board 300.

The circuit board 300 may be attached onto the pad parts of the display panel 100 using, for example, an anisotropic conductive film (ACF). Lead lines of the circuit board 300 may be electrically connected to the pad parts of the display panel 100. The circuit board 300 may be, for example, a flexible printed circuit board, a printed circuit board, or a flexible film such as a chip on film.

The touch driver 400 may be mounted on the circuit board 300. The touch driver 400 may be formed as an integrated circuit (IC). As described above, the touch driver 400 may supply the touch driving signals to the plurality of touch electrodes of the touch sensing unit TSU and sense the change amounts in capacitance between the plurality of touch electrodes. Here, the touch driving signal may be a pulse signal having a predetermined frequency. The touch driver 400 may determine whether a touch input by a user's body part such as a finger has been performed and calculate touch coordinates, based on the change amounts in capacitance between the plurality of touch electrodes.

Referring to FIG. 4, the display panel 100 may include a display unit DU, a touch sensing unit TSU, and a polarizing film. The display unit DU may include a substrate SUB, a thin film transistor layer TFTL, a light emitting element layer EML, and an encapsulation layer TFEL.

The substrate SUB may be a base substrate or a base member. The substrate SUB may be a flexible substrate that may be bent, folded, and rolled. As an example, the substrate SUB may include a glass material or a metal material, but is not limited thereto. As another example, the substrate SUB may include a polymer resin such as polyimide (PI).

The thin film transistor layer TFTL may be disposed on the substrate SUB. The thin film transistor layer TFTL may include a plurality of thin film transistors constituting pixel circuits of pixels. The thin film transistor layer TFTL may further include gate lines, data lines, power lines, gate control lines, fan-out lines connecting the display driver 200 and the data lines to each other, and lead lines connecting the display driver 200 and the pad parts to each other. When the gate driver is formed on one side of the non-display area NDA of the display panel 100, the gate driver may also include thin film transistors.

The thin film transistor layer TFTL may be disposed in the display area DA, the non-display area NDA, and the sub-area SBA. The thin film transistors of each of the pixels, the gate lines, the data lines, and the power lines of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-area SBA.

The light emitting element layer EML may be disposed on the thin film transistor layer TFTL. The light emitting element layer EML may include a plurality of light emitting elements in which a first electrode, a light emitting layer, and a second electrode are sequentially stacked to emit light and a pixel defining layer defining pixels. The plurality of light emitting elements of the light emitting element layer EML may be disposed in the display area DA. The light emitting layer may be an organic light emitting layer including an organic material. The light emitting layer may include, for example, a hole transporting layer, an organic light emitting layer, and an electron transporting layer. When the first electrode receives a predetermined voltage through the thin film transistor of the thin film transistor layer (TFTL) and the second electrode receives a cathode voltage, holes and electrons may move to the organic light emitting layer through the hole transporting layer and the electron transporting layer, respectively, and may be combined with each other in the organic light emitting layer to emit light. For example, the first electrode may be an anode electrode and the second electrode may be a cathode electrode, but embodiments of the present disclosure are not limited thereto.

As another example, the plurality of light emitting elements may include quantum dot light emitting diodes including a quantum dot light emitting layer or inorganic light emitting diodes including an inorganic semiconductor.

The encapsulation layer TFEL may cover an upper surface and side surfaces of the light emitting element layer EML, and may protect the light emitting element layer EML. The encapsulation layer TFEL may include at least one inorganic layer and at least one organic layer for encapsulating the light emitting element layer EML.

The touch sensing unit TSU may be disposed on the encapsulation layer TFEL. The touch sensing unit TSU may include a plurality of touch electrodes for sensing a user's touch in a capacitive manner and touch lines connecting the plurality of touch electrodes and the touch driver 400 to each other. As an example, the touch sensing unit TSU may sense the user's touch using a self-capacitance manner or a mutual capacitance manner.

As another example, the touch sensing unit TSU may be disposed on a separate substrate disposed on the display unit DU. In this case, the substrate supporting the touch sensing unit TSU may be a base member encapsulating the display unit DU.

The plurality of touch electrodes of the touch sensing unit TSU may be disposed in a touch sensor area overlapping the display area DA. The touch lines of the touch sensing unit TSU may be disposed in a touch peripheral area overlapping the non-display area NDA.

The sub-area SBA of the display panel 100 may extend from one side of the main area MA. The sub-area SBA may include a flexible material that may be bent, folded, and rolled. For example, when the sub-area SBA is bent, the sub-area SBA may overlap the main area MA in the thickness direction (Z-axis direction). The sub-area SBA may include the display driver 200 and the pad parts connected to the circuit board 300.

Figure 5:
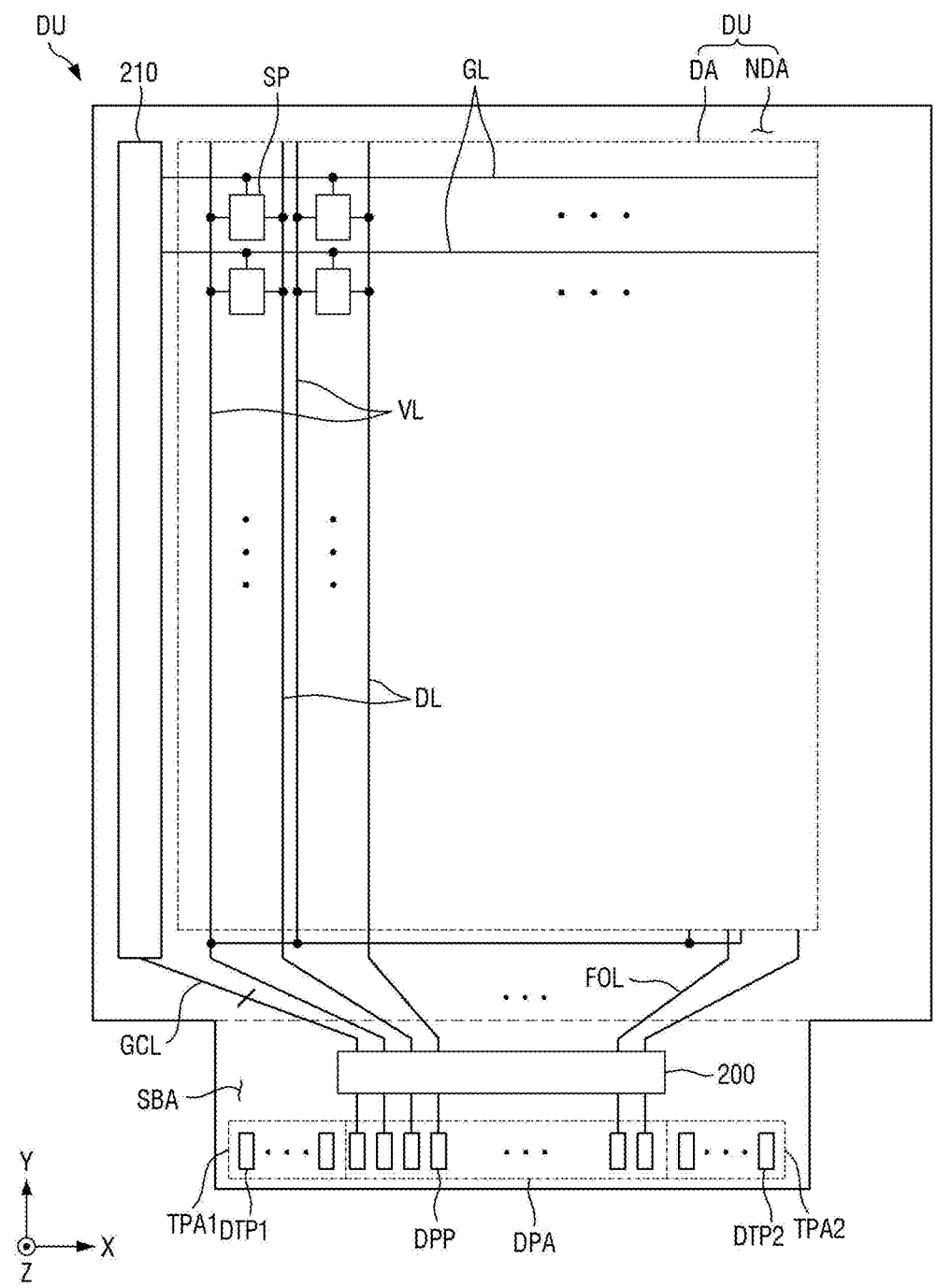
FIG. 5 is a plan view illustrating a display unit of the display device according to an embodiment of the present disclosure.

FIG. 5 is a plan view illustrating a display unit of the display device according to an embodiment of the present disclosure.

Referring to FIG. 5, the display area DA of the display unit DU is an area displaying an image, and may be defined as a central area of the display panel 100. The display area DA may include a plurality of pixels SP, a plurality of gate lines GL, a plurality of data lines DL, and a plurality of power lines VL. Each of the plurality of pixels SP may be defined as a minimum unit outputting light.

The plurality of gate lines GL may supply gate signals received from a gate driver 210 to the plurality of pixels SP. The plurality of gate lines GL may extend in the X-axis direction, and may be spaced apart from each other in the Y-axis direction crossing the X-axis direction.

The plurality of data lines DL may supply data voltages received from the display driver 200 to the plurality of pixels SP. The plurality of data lines DL may extend in the Y-axis direction, and may be spaced apart from each other in the X-axis direction.

The plurality of power lines VL may supply a source voltage received from the display driver 200 to the plurality of pixels SP. Here, the source voltage may be at least one of a driving voltage, an initialization voltage, and a reference voltage. The plurality of power lines VL may extend in the Y-axis direction and may be spaced apart from each other in the X-axis direction.

The non-display area NDA of the display unit DU may surround the display area DA. The non-display area NDA may include the gate driver 210, fan-out lines FOL, and gate control lines GCL. The gate driver 210 may generate a plurality of gate signals based on gate control signals, and may sequentially supply the plurality of gate signals to the plurality of gate lines GL according to a set order.

The fan-out lines FOL may extend from the display driver 200 to the display area DA. The fan-out lines FOL may supply the data voltages received from the display driver 200 to the plurality of data lines DL.

The gate control lines GCL may extend from the display driver 200 to the gate driver 210. The gate control lines GCL may supply the gate control signals received from the display driver 200 to the gate driver 210.

The sub-area SBA may include the display driver 200, a display pad area DPA, and first and second touch pad areas TPA1 and TPA2.

The display driver 200 may output signals and voltages for driving the display panel 100 to the fan-out lines FOL. The display driver 200 may supply the data voltages to the data lines DL through the fan-out lines FOL. The data voltages may be supplied to the plurality of pixels SP, and may determine luminance of the plurality of pixels SP. The display driver 200 may supply the gate control signals to the gate driver 210 through the gate control lines GCL.

The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 300 using, for example, an anisotropic conductive layer or a low-resistance high-reliability material such as a super absorbent polymer (SAP).

The display pad area DPA may include a plurality of display pad parts DPP. The plurality of display pad parts DPP may be connected to the main processor 500 through the circuit board 300. The plurality of display pad parts DPP may be connected to the circuit board 300 to receive digital video data, and may supply the digital video data to the display driver 200.

Figure 6:
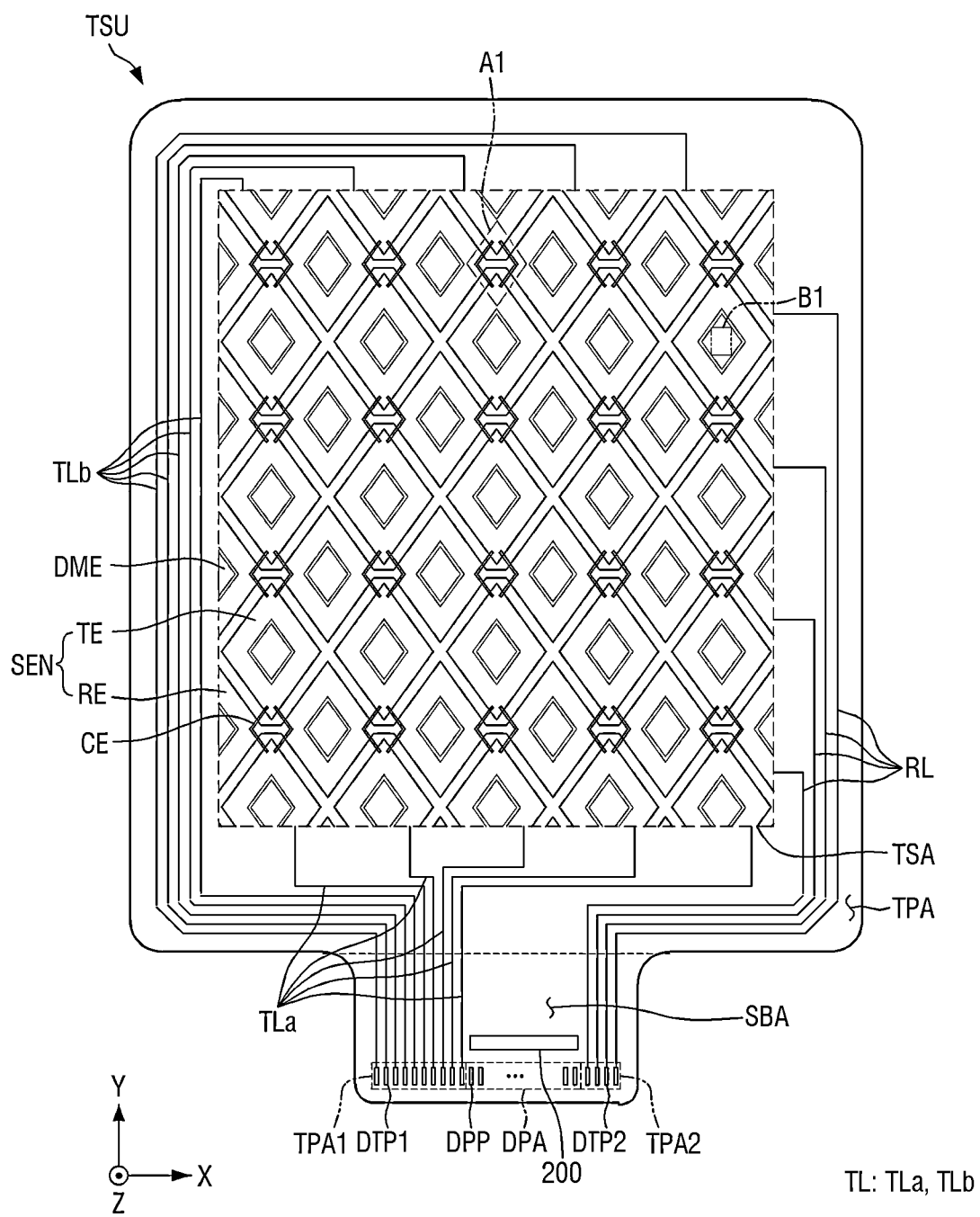
FIG. 6 is a plan view illustrating a touch sensing unit of the display device according to an embodiment of the present disclosure.

FIG. 6 is a plan view illustrating a touch sensing unit of the display device according to an embodiment of the present disclosure.

Referring to FIG. 6, the touch sensing unit TSU may include a touch sensor area TSA sensing a user's touch and a touch peripheral area TPA disposed around the touch sensor area TSA. The touch sensor area TSA may overlap the display area DA of the display unit DU, and the touch peripheral area TPA may overlap the non-display area NDA of the display unit DU.

The touch sensor area TSA may include a plurality of touch electrodes SEN and a plurality of dummy electrodes DME. The plurality of touch electrodes SEN may form mutual capacitance or self-capacitance to sense a touch of an object or a person. The plurality of touch electrodes SEN may include a plurality of driving electrodes TE and a plurality of sensing electrodes RE.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent to each other in the Y-axis direction may be electrically connected to each other through a plurality of connection electrodes CE.

The plurality of driving electrodes TE may be connected to first touch pad parts DTP1 through driving lines TL. The driving lines TL may include lower driving lines TLa and upper driving lines TLb. For example, some driving electrodes TE disposed on the lower side of the touch sensor area TSA may be connected to the first touch pad parts DTP1 through the lower driving lines Tla, and some other driving electrodes TE disposed on the upper side of the touch sensor area TSA may be connected to the first touch pad parts DTP1 through the upper driving lines TLb. The lower driving lines Tla may extend to the first touch pad parts DTP1 beyond the lower side of the touch peripheral area TPA. The upper driving lines TLb may extend to the first touch pad parts DTP1 via the upper side, the left side, and the lower side of the touch peripheral area TPA. The first touch pad parts DTP1 may be connected to the touch driver 400 through the circuit board 300.

The connection electrode CE may be bent at least once. For example, the connection electrode CE may have a clamp shape ("<" or ">"), but a shape of the connection electrode CE in a plan view is not limited thereto. The driving electrodes TE adjacent to each other in the Y-axis direction may be electrically connected to each other by the plurality of connection electrodes CE. In the event that any one of the plurality of connection electrodes CE is disconnected, the driving electrodes TE may remain stably connected to each other through the other connection electrodes CE. The driving electrodes TE disposed adjacent to each other may be connected to each other by two connection electrodes CE, but the number of connection electrodes CE is not limited thereto.

The connection electrodes CE may be disposed at a different layer from the plurality of driving electrodes TE and the plurality of sensing electrodes RE. The sensing electrodes RE adjacent to each other in the X-axis direction may be electrically connected to each other through a connection part disposed at the same layer as the plurality of driving electrodes TE or the plurality of sensing electrodes RE. That is, the plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE disposed adjacent to each other in the X-axis direction may be electrically connected to each other through the connection part.

The driving electrodes TE disposed adjacent to each other in the Y-axis direction may be electrically connected to each other through the connection electrodes CE disposed at the different layer from the plurality of driving electrodes TE and the plurality of sensing electrodes RE. The connection electrodes CE may be formed at a rear surface layer (or a lower layer) of a layer at which the driving electrodes TE and the sensing electrodes RE are formed. The connection electrodes CE are electrically connected to the respective adjacent driving electrodes TE through a plurality of contact holes. Accordingly, even though the connection electrodes CE overlap the plurality of sensing electrodes RE in the Z-axis direction, the plurality of driving electrodes TE and the plurality of sensing electrodes RE may be insulated from each other. Mutual capacitance may be formed between the driving electrodes TE and the sensing electrodes RE.

The plurality of sensing electrodes RE may be connected to second touch pad parts DTP2 through sensing lines RL. For example, some sensing electrodes RE disposed on the right side of the touch sensor area TSA may be connected to the second touch pad parts DTP2 through the sensing lines RL. The sensing lines RL may extend to the second touch pad parts DTP2 via the right side and the lower side of the touch peripheral area TPA. The second touch pad parts DTP2 may be connected to the touch driver 400 through the circuit board 300.

Each of the plurality of dummy electrodes DME may be surrounded by the driving electrode TE or the sensing electrode RE. Each of the plurality of dummy electrodes DME may be spaced apart and insulated from the driving electrode TE or the sensing electrode RE. Accordingly, the dummy electrode DE may be electrically floated.

Code patterns having a planar code shape are formed at preset intervals on partial areas of front surfaces of at least one of the plurality of driving electrodes TE, the plurality of sensing electrodes RE, and the plurality of dummy electrodes DME. In addition, tilt sensing patterns are formed on areas of front surfaces of touch electrodes disposed around the code patterns.

The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 300 using, for example, an anisotropic conductive layer or a low-resistance high-reliability material such as an SAP.

The first touch pad area TPA1 may be disposed on one side of the display pad area DPA, and may include a plurality of first touch pad parts DTP1. The plurality of first touch pad parts DTP1 may be electrically connected to the touch driver 400 disposed on the circuit board 300. The plurality of first touch pad parts DTP1 may supply the touch driving signals to the plurality of driving electrodes TE through a plurality of driving lines TL.

The second touch pad area TPA2 may be disposed on the other side of the display pad area DPA, and may include a plurality of second touch pad parts DTP2. The plurality of second touch pad parts DTP2 may be electrically connected to the touch driver 400 disposed on the circuit board 300. The touch driver 400 may receive touch sensing signals through a plurality of sensing lines RL connected to the plurality of second touch pad parts DTP2, and may sense a change in mutual capacitance between the driving electrodes TE and the sensing electrodes RE.

As another example, the touch driver 400 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driver 400 may sense an amount of change in charge of each of the plurality of driving electrodes TE and the plurality of sensing electrodes RE based on the touch sensing signal.

Figure 7:
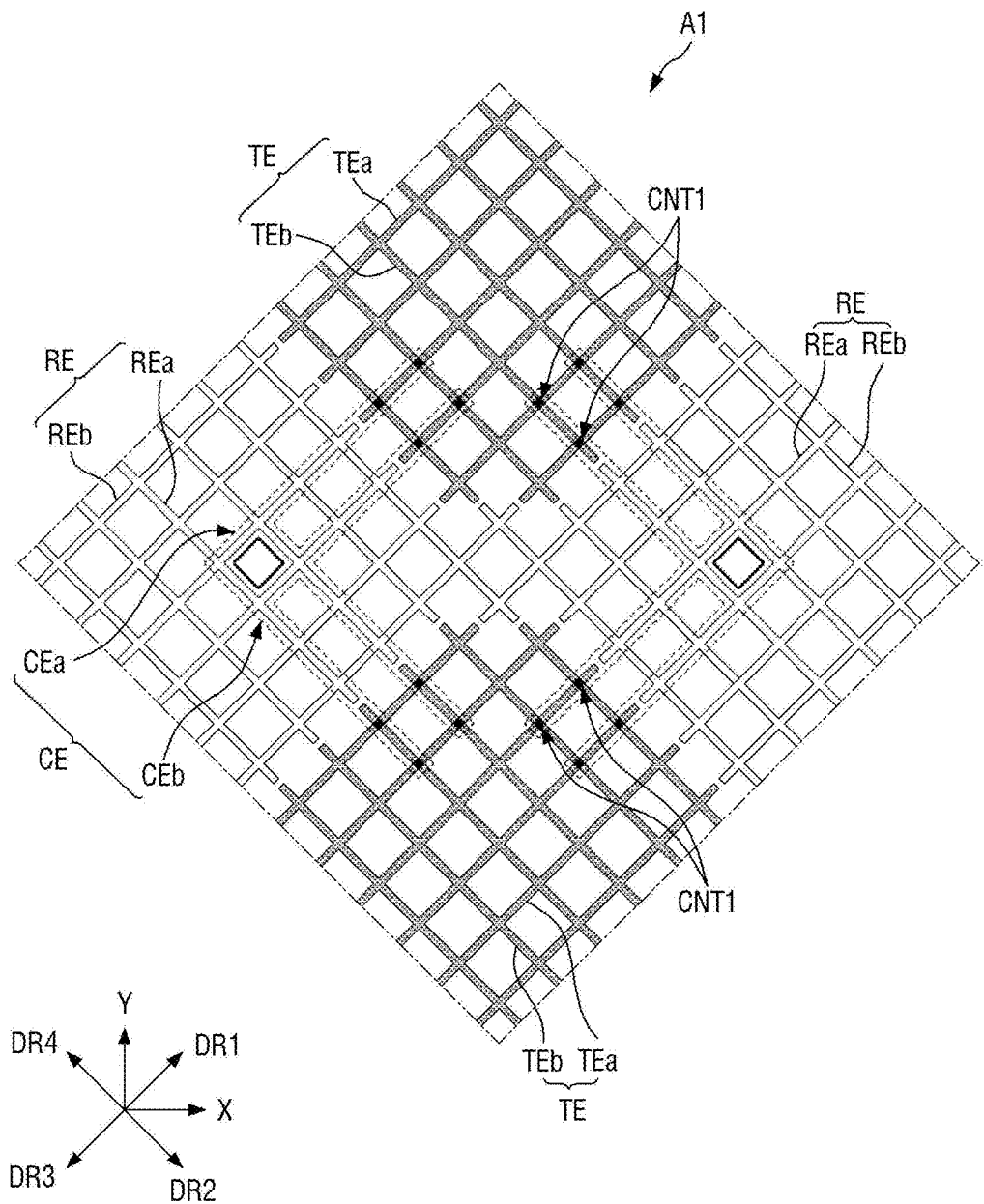
FIG. 7 is an enlarged view illustrating area A1 of FIG. 6 according to an embodiment of the present disclosure.
Figure 8:
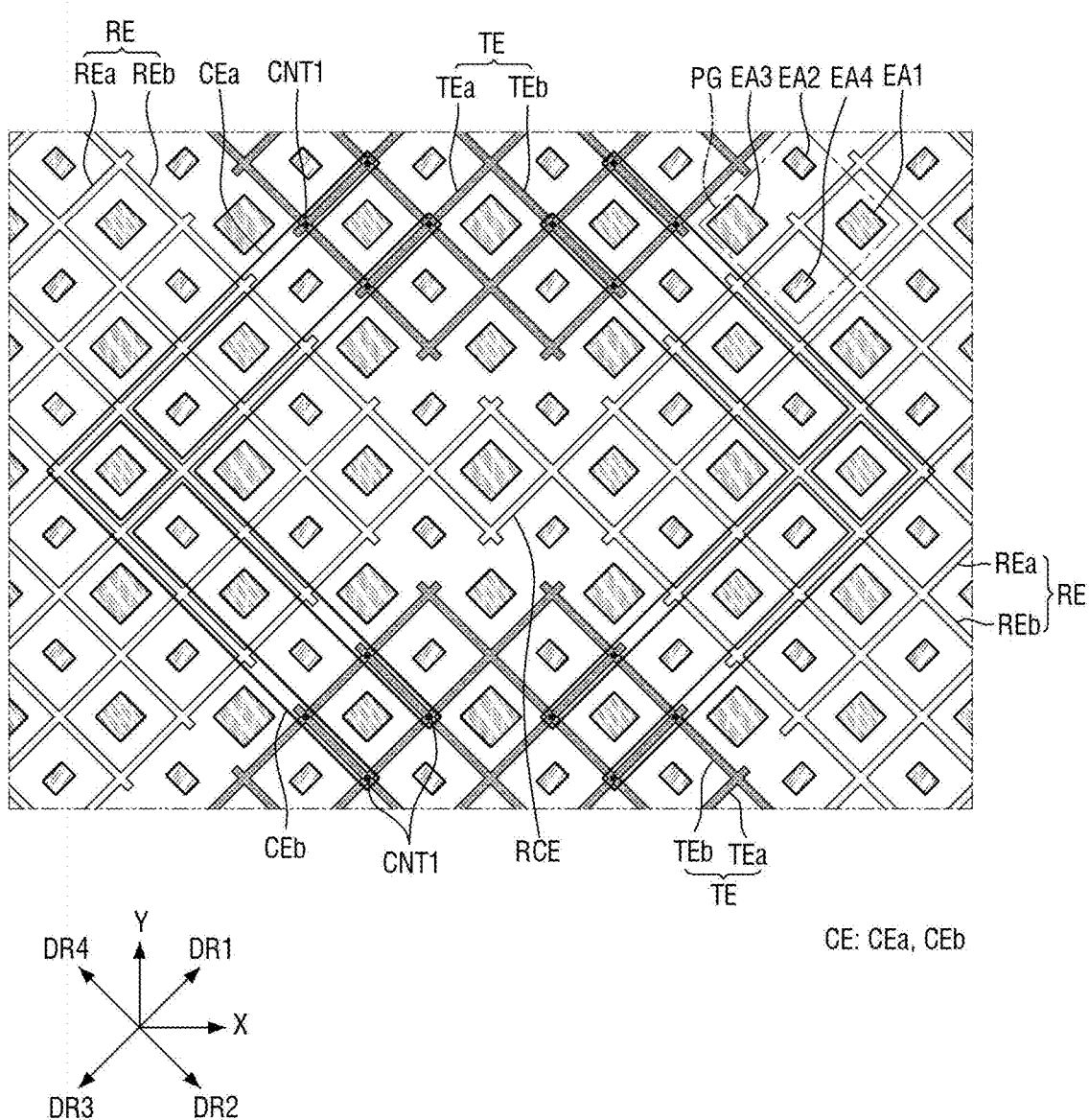
FIG. 8 is an enlarged view illustrating structures of a connection electrode and a connection part of sensing electrodes of FIG. 7 according to an embodiment of the present disclosure.

FIG. 7 is an enlarged view illustrating area A1 of FIG. 6 according to an embodiment of the present disclosure. FIG. 8 is an enlarged view illustrating structures of a connection electrode and a connection part of sensing electrodes of FIG. 7 according to an embodiment of the present disclosure.

Referring to FIGS. 7 and 8, the plurality of driving electrodes TE, the plurality of sensing electrodes RE, and the plurality of dummy electrodes DME may be disposed at the same layer and may be spaced apart from each other.

The plurality of driving electrodes TE may be arranged in the X-axis direction and the Y-axis direction. The plurality of driving electrodes TE may be spaced apart from each other in the X-axis direction and the Y-axis direction. The driving electrodes TE disposed adjacent to each other in the Y-axis direction may be electrically connected to each other through the connection electrodes CE.

The plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE disposed adjacent to each other in the X-axis direction may be electrically connected to each other. For example, the sensing electrodes RE may be electrically connected to each other through the connection part, and the connection part may be disposed within the shortest distance between the driving electrodes TE disposed adjacent to each other.

The plurality of connection electrodes CE may be disposed at a different layer from the driving electrodes TE and the sensing electrodes RE, for example, a rear surface layer. The connection electrode CE may include a first portion Cea and a second portion Ceb. For example, the first portion Cea of the connection electrode CE may be connected to the driving electrode TE disposed on one side through a first contact hole CNT1 and may extend in a third direction DR3.

The second portion Ceb of the connection electrode CE may be bent from the first portion Cea in an area overlapping the sensing electrode RE, may extend in a second direction DR2, and may be connected to the driving electrode TE disposed on the other side through a first contact hole CNT1. Hereinafter, a first direction DR1 may be a direction between the X-axis direction and the Y-axis direction, the second direction DR2 may be a direction between an opposite direction to the Y-axis direction and the X-axis direction, the third direction DR3 may be an opposite direction to the first direction DR1, and the fourth direction DR4 may be an opposite direction to the second direction DR2. Accordingly, each of the plurality of connection electrodes CE may connect the driving electrodes TE disposed adjacent to each other in the Y-axis direction to each other.

Each pixel group PG may include first to third sub-pixels or first to fourth sub-pixels, and each of the first to fourth sub-pixels may include first to fourth emission areas EA1, EA2, EA3, and EA4. For example, the first emission area EA1 may emit light of a first color (e.g., red light), the second emission area EA2 may emit light of a second color (e.g., green light), and the third emission area EA3 may emit light of a third color (e.g., blue light). In addition, the fourth emission area EA4 may emit light of a fourth color or light of any one of the first to third colors, but is not limited thereto.

One pixel group PG may express a white gradation through the first to third emission areas EA1 to EA3 or the first to fourth emission areas EA1 to EA4. In addition, gradations of various colors such as white may be expressed by a combination of light emitted from the first to third emission areas EA1 to EA3 or the first to fourth emission areas EA1 to EA4.

According to an arrangement structure of the first to third sub-pixels or the first to fourth sub-pixels, the plurality of driving electrodes TE, the plurality of sensing electrodes RE, and the plurality of dummy electrodes DME may be formed in a mesh structure or a net structure in a plan view.

The plurality of driving electrodes TE, the plurality of sensing electrodes RE, and the plurality of dummy electrodes DME may surround portions between and circumferences of the first to third emission areas EA1 to EA3 or the first to fourth emission areas EA1 to EA4 constituting the pixel group PG in a plan view. Accordingly, in embodiments, the plurality of driving electrodes TE, the plurality of sensing electrodes RE, and the plurality of dummy electrodes DME do not overlap the first to fourth emission areas EA1 to EA4. In embodiments, the plurality of connection electrodes CE also do not overlap the first to fourth emission areas EA1 to EA4. Accordingly, the display device 10 may prevent luminance of the light emitted from the first to fourth emission areas EA1 to EA4 from being decreased by the touch sensing unit TSU.

In embodiments, each of the plurality of driving electrodes TE may be formed to include a first portion Tea extending in the first direction DR1 and a second portion Teb extending in the second direction DR2, and do not overlap the first to fourth emission areas EA1 to EA4. In addition, in embodiments, each of the plurality of sensing electrodes RE may be formed to include a first portion Rea extending in the first direction DR1 and a second portion Reb extending in the second direction DR2, and do not overlap the first to fourth emission areas EA1 to EA4. In embodiments, the plurality of dummy electrodes DME are also formed so as not to overlap the first to fourth emission areas EA1 to EA4.

Figure 9:
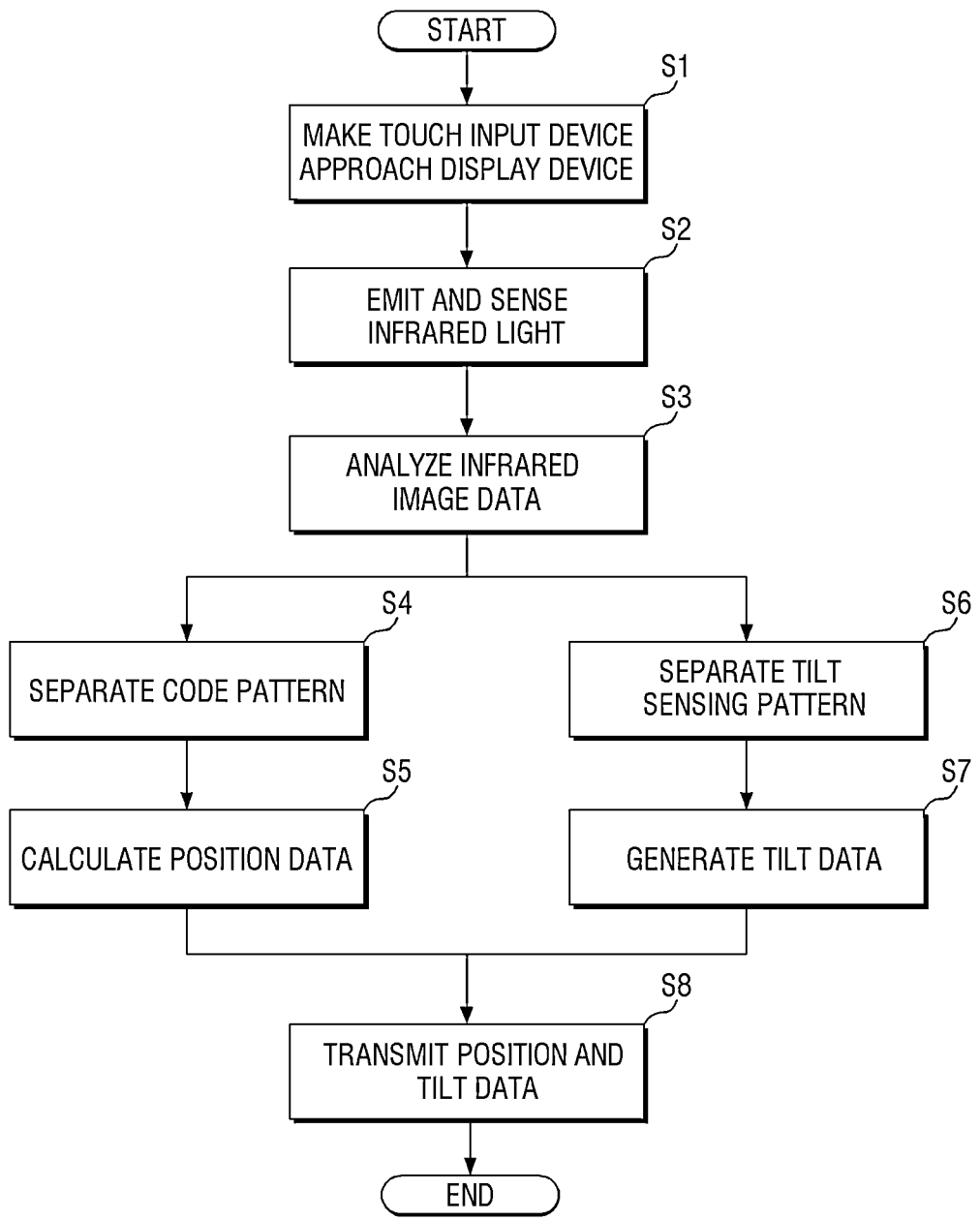
FIG. 9 is a flowchart illustrating a method of calculating a direction and a tilt of a position input device using tilt sensing pattern detected images according to an embodiment of the present disclosure.

FIG. 9 is a flowchart illustrating a method of calculating a direction and a tilt of a position input device using tilt sensing pattern detected images.

Referring to FIGS. 2 and 9, when the code detection unit 21 of the position input device 20 is positioned on the display panel 100 according to control of a user, the code detection unit 21 emits infrared light to the display panel 100 and receives infrared light reflected from the code patterns and the tilt sensing patterns. In this case, the code detection unit 21 continuously generates shape data of the code patterns and the tilt sensing patterns according to shapes of the infrared light reflected from the code patterns and the tilt sensing patterns, and continuously transmits the shape data of the code patterns and the tilt sensing patterns to the code processor 23 (S1 and S2).

The code processor 23 continuously receives the shape data of the code patterns and the tilt sensing patterns, and identifies each of arrangement structures and shapes of the code patterns and the tilt sensing patterns (S3). The code processor 23 separately extracts data codes corresponding to the arrangement structure and the shape of the code patterns from the shape data input in real time, and extracts or generates coordinate data corresponding to the data codes. That is, the code processor 23 transmits the generated coordinate data to the display device 10 through the communication module 24. For example, the code processor 23 may generate and convert data codes for a code shape identified with the code patterns to quickly generate coordinate data without performing complicated calculation and correction operations (S4 and S5).

In embodiments, the code processor 23 identifies and detects image data corresponding to shapes of the tilt sensing patterns separately from the code patterns from the shape data of the code patterns and the tilt sensing patterns. In addition, the code processor 23 may transmit the detected image data corresponding to the tilt sensing patterns to the display device 10 through the communication module 24 (S6).

The main processor 500 of the display device 10 receives the detected image data corresponding to the tilt sensing patterns together with the coordinate data from the position input device 20. In addition, the main processor 500 analyzes the detected image data corresponding to the tilt sensing patterns to determine arrangement direction and tilt information of the position input device 20. In this case, the main processor 500 detects, and compares and analyzes sensed areas or sensed luminance values for tilt sensing pattern images corresponding to the plurality of tilt sensing patterns TIP with each other through the detected image data of the tilt sensing patterns. In addition, the main processor 500 may determine the arrangement direction and tilt information of the position input device 20 according to a comparison result of the sensed areas or the sensed luminance values for the tilt sensing pattern images (S7). According to the result of such a determination, the main processor 500 may generate digital video data according to the arrangement direction and tilt information of the position input device 20 or execute an application corresponding to the arrangement direction and tilt information.

In embodiments, the code processor 23 of the position input device 20 may also determine the arrangement direction and tilt information of the position input device 20. In this case, the code processor 23 identifies and detects image data corresponding to the shapes of the tilt sensing patterns from the shape data input from the code detection unit 21. In addition, the code processor 23 analyzes the detected image data corresponding to the tilt sensing patterns to determine arrangement direction and tilt information of the position input device 20. In this case, the code processor 23 may detect, and compare and analyze sensed areas or sensed luminance values for tilt sensing pattern images with each other through the detected image data of the tilt sensing patterns. In addition, the code processor 23 may determine the arrangement direction and tilt information of the position input device 20 according to a comparison result of the sensed areas or the sensed luminance values for the tilt sensing pattern images (S7). The code processor 23 may transmit the arrangement direction and tilt information of the position input device 20 to the display device 10 through the communication module 24 (S8).

Hereinafter, a method of calculating the arrangement direction and the tilt of the position input device 20 using tilt sensing pattern detected images will be described in more detail with reference to the accompanying drawings.

Figure 10:
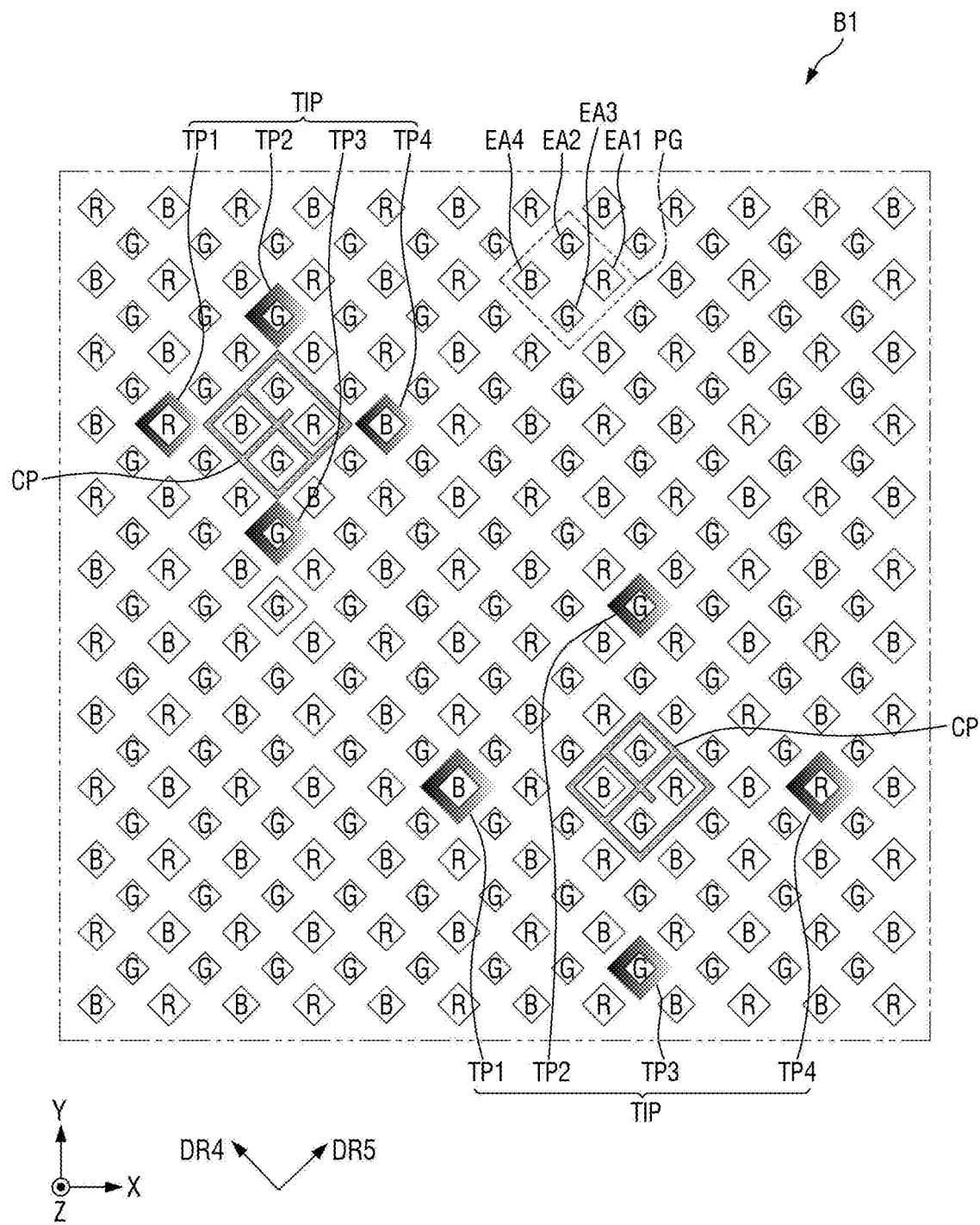
FIG. 10 is an enlarged view illustrating an arrangement structure of code patterns and tilt sensing patterns formed in area B1 of FIG. 6 according to an embodiment of the present disclosure.

FIG. 10 is an enlarged view illustrating an arrangement structure of code patterns and tilt sensing patterns formed in area B1 of FIG. 6 according to an embodiment of the present disclosure.

Referring to FIGS. 8 and 10, code patterns CP and tilt sensing patterns TIP may be formed on front surfaces (that is, upper surfaces in a z-axis direction) of the plurality of dummy electrodes DME, the plurality of driving electrodes TE (of the touch electrodes SEN), and the plurality of sensing electrodes RE (of the touch electrodes SEN). Thus, as can be seen in FIGS. 6 and 10, in an embodiment, the plurality of touch electrodes SEN are disposed between the plurality of emission areas EA1 to EA4. The code patterns CP and the tilt sensing patterns TIP may be simultaneously formed through the same process or may be sequentially formed.

The code patterns CP are formed at predetermined intervals (e.g., intervals of about 300 μm) on partial areas of the front surfaces of the plurality of dummy electrodes DME, the plurality of driving electrodes TE, and the plurality of sensing electrodes RE. The tilt sensing patterns TIP are formed on portions of front surfaces of the plurality of dummy electrodes DME, the plurality of driving electrodes TE, and the plurality of sensing electrodes RE other than the areas where the code patterns CP are formed.

The respective code patterns CP are formed by covering partial areas of front surfaces of at least one of the plurality of driving electrodes TE, the plurality of sensing electrodes RE, and the plurality of dummy electrodes DME with planar code shapes having a preset size. In this case, the respective code patterns CP may be formed to cover not only partial areas of the front surfaces of the respective electrodes, but also at least one side surface of the respective electrodes together with the front surfaces.

The code patterns CP may be formed to minimize or reduce reflectivity of the infrared light by blocking and reflecting the infrared light applied from the position input device 20, and may be recognized as code patterns by the position input device 20 according to a code shape in which the reflectivity of the infrared light is minimized or reduced.

The planar code shape of the code patterns CP may be formed as a closed loop shape such as, for example, a rectangular shape, a square shape, a circular shape, or a polygonal shape. Alternatively, the planar code shape of the code patterns CP may be formed as an open loop shape surrounding only a portion of one emission area. In addition, the planar code shape of the code patterns CP may be formed as a straight line or a curved shape having a preset length. In embodiments, when the code patterns CP surround both portions between and circumferences of the plurality of emission areas rather than one emission area, a shape of each of the code patterns CP may be formed as a mesh structure and a net structure in a plan view.

Figure 11:
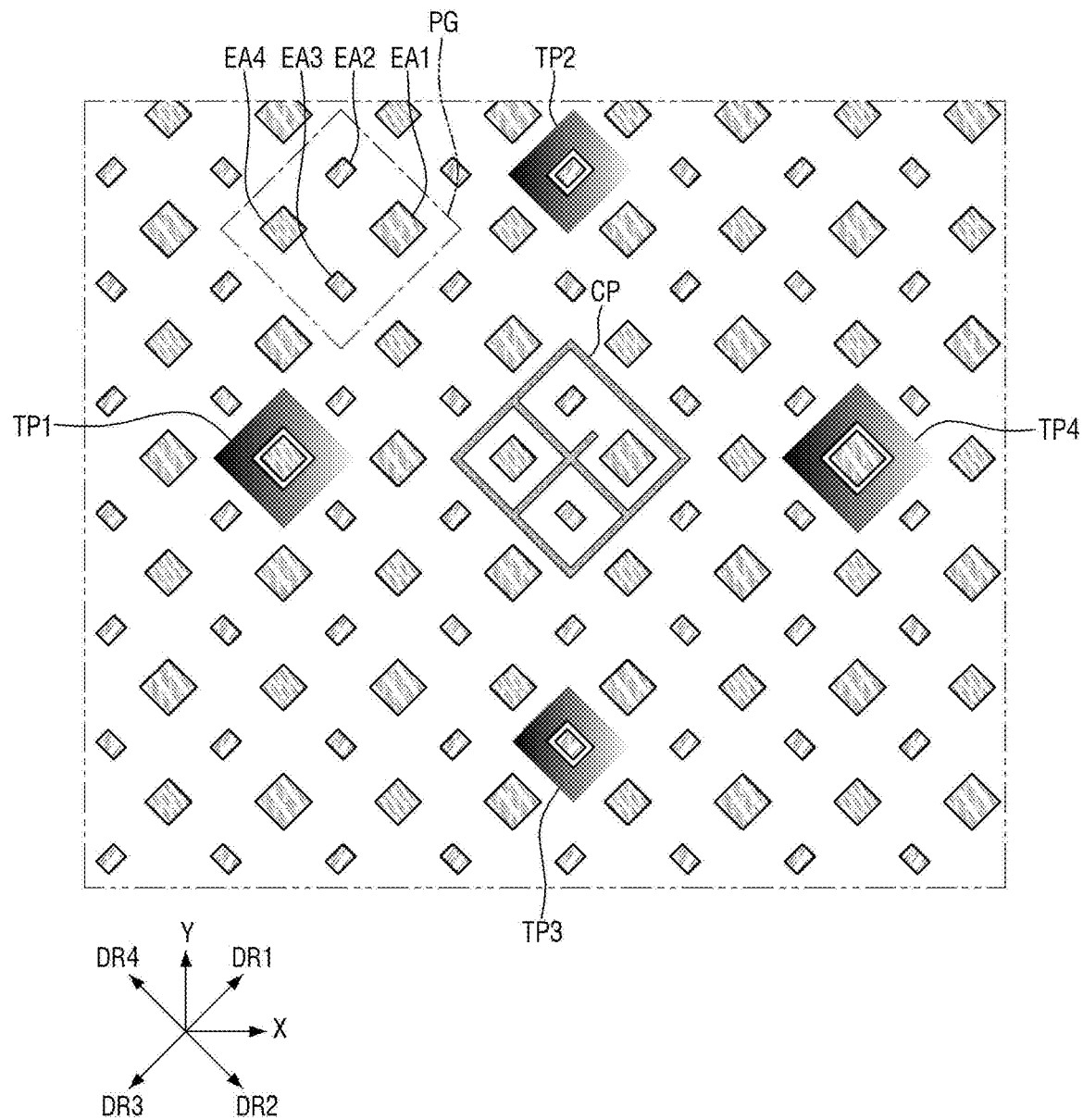
FIG. 11 is an enlarged view illustrating any one code pattern of FIG. 10 and tilt sensing patterns around the code pattern according to an embodiment of the present disclosure.

FIG. 11 is an enlarged view illustrating any one code pattern of FIG. 10 and tilt sensing patterns around the code pattern according to an embodiment of the present disclosure.

Referring to FIGS. 10 and 11, the tilt sensing patterns TIP may be formed after the code patterns CP are formed, or the code patterns CP may be formed after the tilt sensing patterns TIP are first formed. The tilt sensing patterns TIP may be selectively formed in a preset peripheral area of the code patterns CP.

The tilt sensing patterns TIP may be formed within a preset thickness or height so as to have a light blocking function, but so as to be recognized as the tilt sensing patterns TIP rather than the code patterns CP by the position input device 20.

The tilt sensing patterns TIP may be formed in a closed loop shape such as, for example, a rectangular shape, a square shape, a circular shape, or a rhombic shape in a plan view. Alternatively, the tilt sensing patterns TIP may be formed in an open loop shape surrounding only a portion of one emission area. In addition, the tilt sensing patterns TIP may be formed in a straight line or a curved shape having a preset length. In embodiments, when the tilt sensing patterns TIP surround both portions between and circumferences of the plurality of emission areas rather than one emission area, a shape of each of the tilt sensing patterns TIP may be formed as a mesh structure and a net structure in a plan view. An example in which the tilt sensing patterns TIP are formed in a rhombus shape, in a plan view, forming a closed loop will hereinafter be described.

The tilt sensing patterns TIP may be respectively disposed around each of the code patterns CP in at least two directions of each of the code patterns CP in a plan view, for example, around each of the code patterns CP in an x-axis direction x, which is a horizontal direction of each of the code patterns CP, and a y-axis direction y, which is a vertical direction (or an upward direction) of each of the code patterns CP, in a plan view. In addition, the tilt sensing patterns TIP may be respectively disposed around each of the code patterns CP in at least four directions in a plan view, for example, around each of the code patterns CP in an x-axis direction x and a −x-axis direction, which are horizontal directions of both sides of each of the code patterns CP, and a y-axis direction y and a −y-axis direction, which are upward and downward directions of each of the code patterns CP.

For example, the tilt sensing patterns TIP may include a first sensing pattern TP1 disposed in a horizontal direction (−x-axis direction −x) of one side (e.g., a first side) of each of the code patterns CP and a second sensing pattern TP2 disposed in an upward direction (y-axis direction y) of one side (e.g., a second side) of each of the code patterns CP. In addition, the tilt sensing patterns TIP may further include a third sensing pattern TP3 disposed in a downward direction (−y-axis direction) of the other side (e.g., a fourth side opposing the second side) of each of the code patterns CP and a fourth sensing pattern TP4 disposed in a horizontal direction (x-axis direction x) of the other side (e.g., a third side opposing the first side) of each of the code patterns CP.

The first to fourth sensing patterns TP1 to TP4 are respectively disposed in at least two directions or at least four directions of each of the code patterns CP, such that the tilt sensing patterns TIP disposed around the code patterns CP may be detected together with the code patterns CP when the code patterns CP are detected by the position input device 20 in a front surface or any one side surface direction.

Figure 12:
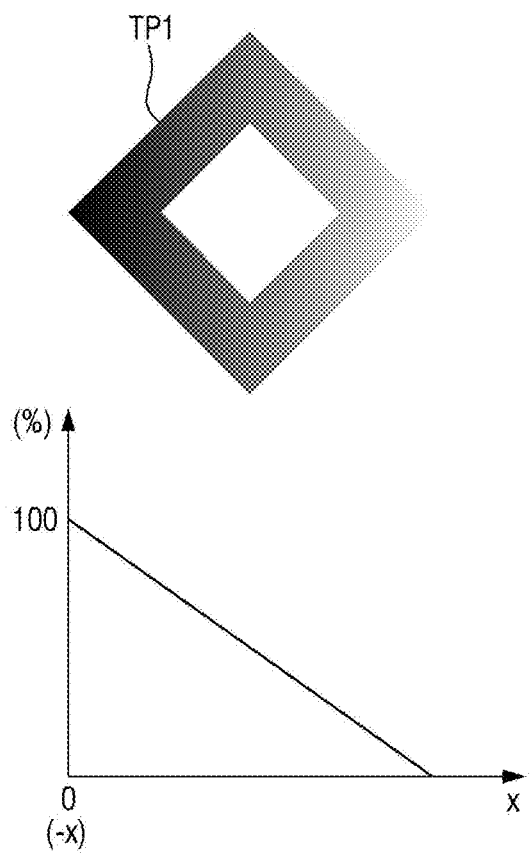
FIG. 12 is a view for describing any one tilt sensing pattern illustrated in FIGS. 10 and 11 and a distribution of an absorbent in the tilt sensing pattern according to an embodiment of the present disclosure.

FIG. 12 is a view for describing any one tilt sensing pattern illustrated in FIGS. 10 and 11 and a distribution of an absorbent in the tilt sensing pattern according to an embodiment of the present disclosure.

Referring to FIG. 12, the tilt sensing patterns TIP may be formed of the same material as the light blocking members forming the code patterns CP. However, a content of an absorbent included in light blocking members forming the tilt sensing patterns TIP so as to absorb the infrared light may be set to be different from that in the code patterns CP. Each of the light blocking members forming the tilt sensing patterns TIP may be formed by including an absorbent in a preset amount in a coating member made of an organic or inorganic material.

The content of the absorbent included in each of the tilt sensing patterns TIP may gradually increase or decrease in at least one direction. For example, the content of the absorbent included in the light blocking member forming each of the tilt sensing patterns TIP, that is, the coating member, may be the highest in any one side direction and gradually decrease from any one side direction to the other side direction opposite to any one side direction. As an example, as illustrated in FIG. 12, a content of an absorbent included in a light blocking member forming the first sensing pattern TP1 may gradually decrease according to a preset ratio from the −x-axis direction −x, which is one side direction, to the x-axis direction x, which is the other side direction. Here, the content of the absorbent in the light blocking member may be a ratio of a weight of the absorbent to a weight of the coating member. Accordingly, the content of the absorbent included in the light blocking member may gradually decrease from about 100% in one side direction to about 0% in the other side direction.

The content of the absorbent included in each of the tilt sensing patterns TIP gradually increases or decreases in at least one direction, such that differences in, for example, absorption amount, reflectivity, etc., of the infrared light may become clearer for each direction according to the arrangement direction and the tilt of the position input device 20.

As described above, the light blocking member may be formed to include an inorganic or organic pigment, which is the infrared light absorbent, as well as the coating member.

The coating member may be made of an organic material such as, for example, an acrylic resin, an epoxy resin, a phenolic resin, a polyamide resin, or a polyimide resin. The inorganic pigment, which is the absorbent, may be a pigment including at least one of, for example, carbon black, cyanine, polymethine, anthraquinone, and phthalocyanine-based compounds. The organic pigment may include at least one of, for example, lactam black, perylene black, and aniline black, but is not limited thereto.

Figure 13:
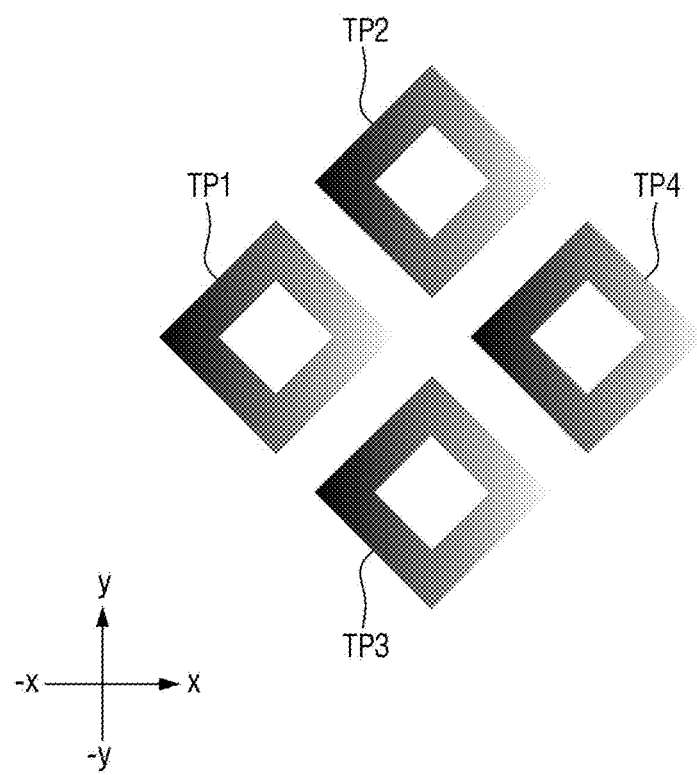
FIG. 13 is a view illustrating detected images, in a front surface direction, of the tilt sensing patterns illustrated in FIG. 11 according to an embodiment of the present disclosure.

FIG. 13 is a view illustrating detected images, in a front surface direction, of the tilt sensing patterns illustrated in FIG. 11 according to an embodiment of the present disclosure.

Referring to FIG. 13, the position input device 20 may be disposed in a front surface direction of the display panel 100 to detect infrared light reflected from any one code pattern CP and the tilt sensing patterns TIP on a front surface and generate detected image data in the front surface direction for the code pattern CP and the tilt sensing patterns TIP. In addition, the main processor 500 or the code processor 23 may distinguish detected images for the tilt sensing patterns TIP, that is, the first to fourth sensing patterns TP1 to TP4, from the detected image data in the front surface direction.

As an example, the position input device 20 may be disposed in a front surface direction of any one code pattern CP and the first to fourth sensing patterns TP1 to TP4 as illustrated in FIG. 11 to generate detected image data in the front surface direction for the code pattern CP and the first to fourth sensing patterns TP1 to TP4. The main processor 500 or the code processor 23 may distinguish and analyze detected images for the first to fourth sensing patterns TP1 to TP4 from the detected image data in the front surface direction.

In addition, the main processor 500 may correct a size of the detected image of each of the first to fourth sensing patterns TP1 to TP4 according to a distance between the display panel 100 and the position input device 20. In this case, the main processor 500 may correct the size of the detected image by increasing or decreasing the size of the detected image in proportion to or in inverse proportion to the distance between the display panel 100 and the position input device 20. Next, the main processor 500 calculates detected areas sensed differently according to amounts of reflected light from the corrected detected image of each of the first to fourth sensing patterns TP1 to TP4.

When the position input device 20 is disposed on the front surface of the display panel 100 to distinguish the detected images of the first to fourth sensing patterns TP1 to TP4 and calculate the detected areas according to the amounts of reflected light, light amount detected areas corresponding to a content ratio of the absorbent may be calculated. Accordingly, the main processor 500 may set the detected images and the detected areas of the first to fourth sensing patterns TP1 to TP4 detected at a preset reference distance of the front surface as reference detected images and reference detected areas. When detected images and light amount detected areas of the first to fourth sensing patterns TP1 to TP4 detected at any one point in time are the same as the reference detected images and the reference detected areas or similar to the reference detected images and the reference detected areas within reference error ranges, the main processor 500 may determine the arrangement direction of the position input device 20 as the front surface direction and the tilt of the position input device 20 as being substantially perpendicular to the front surface direction.

In embodiments, the detected images and the light amount detected areas of the first to fourth sensing patterns TP1 to TP4 may be detected differently according to the arrangement direction and the tilt of the position input device 20. As an example, as an amount of absorbed infrared light decreases and an amount of light received by the position input device 20 increases according to the arrangement direction and the tilt of the position input device 20, a bright light amount detected area may become greater than a black reflected light loss area. To the contrary, as the amount of absorbed infrared light increases and the amount of light received by the position input device 20 decreases due to a large reflection angle, the bright light amount detected area may become smaller than the black reflected light loss area.

Figure 14:
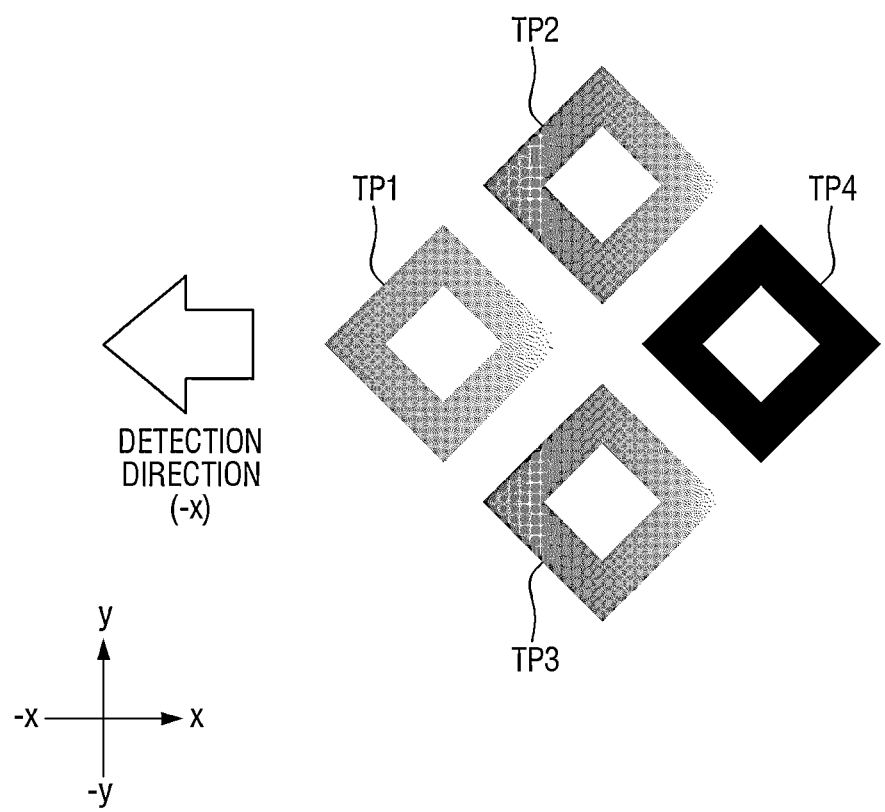
FIG. 14 is a view illustrating detected images, in a −x-axis direction, of the tilt sensing patterns illustrated in FIG. 11 according to an embodiment of the present disclosure.

FIG. 14 is a view illustrating detected images, in a −x-axis direction, of the tilt sensing patterns illustrated in FIG. 11 according to an embodiment of the present disclosure.

Referring to FIG. 14, the position input device 20 may be disposed with a predetermined tilt in the −x-axis direction −x, which is one side surface direction of the display panel 100, to detect infrared light reflected from any one code pattern CP and the tilt sensing patterns TIP and generate detected image data in the −x-axis direction −x for the code pattern CP and the tilt sensing patterns TIP. In addition, the main processor 500 may distinguish a detected image for each of the tilt sensing patterns TIP, that is, the first to fourth sensing patterns TP1 to TP4, from the detected image data in the −x-axis direction −x for the code pattern CP and the tilt sensing patterns TIP.

The main processor 500 corrects a size of the detected image of each of the first to fourth sensing patterns TP1 to TP4 according to a distance between the display panel 100 and the position input device 20. In addition, the main processor 500 calculates detected areas detected differently according to amounts of reflected light from the corrected detected image of each of the first to fourth sensing patterns TP1 to TP4.

As described above, the detected images and the light amount detected areas of the first to fourth sensing patterns TP1 to TP4 may be detected differently according to the arrangement direction and the tilt of the position input device 20. As illustrated in FIG. 14, a reflection angle of the first sensing pattern TP1 disposed most adjacent to the position input device 20 is the smallest and loss of an amount of reflected light of the first sensing pattern TP1 is the smallest, such that the light amount detected area of the first sensing pattern TP1 may be detected to be the greatest and brightest as compared with the second to fourth sensing patterns TP2 to TP4. On the other hand, a reflection angle of the fourth sensing pattern TP4 positioned farthest from the position input device 20 is the greatest and loss of an amount of reflected light of the fourth sensing pattern TP4 is the greatest, such that the light amount detected area of the fourth sensing pattern TP4 may be detected in black to be the smallest as compared with the first to third sensing patterns TP1 to TP3.

The main processor 500 calculates the light amount detected areas according to amounts of reflected light from the detected image of each of the first to fourth sensing patterns TP1 to TP4, and compares the light amount detected areas of the first to fourth sensing patterns TP1 to TP4 with each other. In addition, the main processor 500 may determine the arrangement direction of the position input device 20 so as to correspond to an arrangement direction of the first sensing pattern TP1 calculated as having the greatest light amount detected area among the first to fourth sensing patterns TP1 to TP4.

In addition, the main processor 500 may determine the tilt of the position input device 20 according to the light amount detected area for at least one of the first to fourth sensing patterns TP1 to TP4. As an example, the main processor 500 may determine that a horizontal tilt of the position input device 20 becomes greater as the light amount detected area becomes greater and determine that a horizontal tilt of the position input device 20 becomes smaller as the light amount detected area becomes smaller, in accordance with the light amount detected area of the first sensing pattern TP1 calculated as having the greatest light amount detected area among the first to fourth sensing patterns TP1 to TP4.

Figure 15:
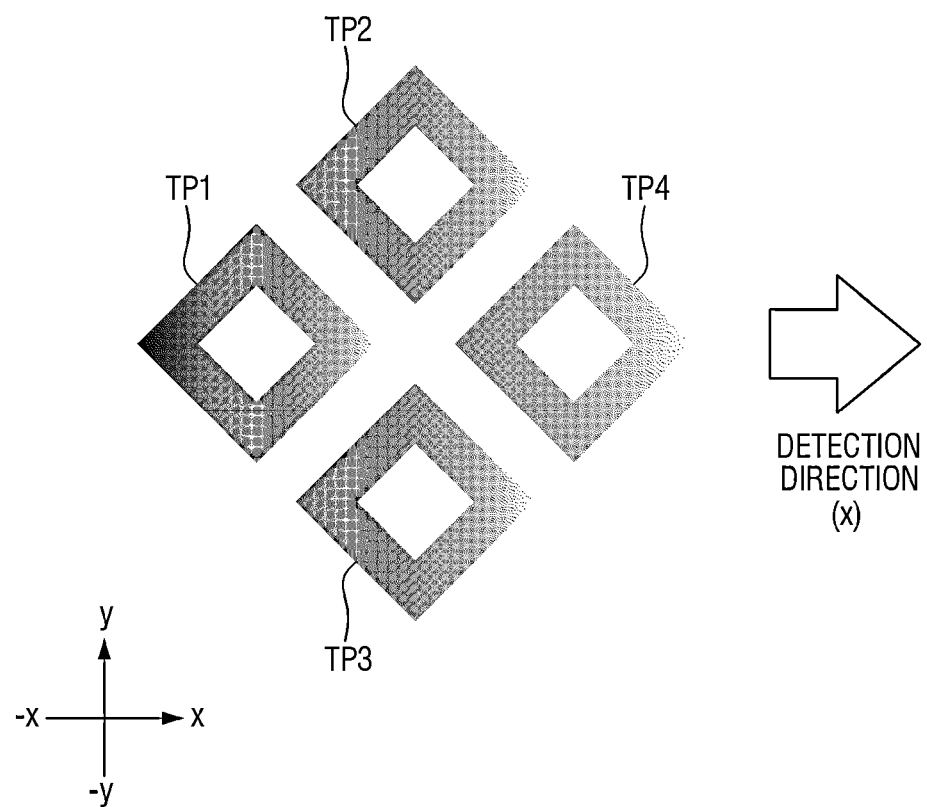
FIG. 15 is a view illustrating detected images, in an x-axis direction, of the tilt sensing patterns illustrated in FIG. 11 according to an embodiment of the present disclosure.

FIG. 15 is a view illustrating detected images, in an x-axis direction, of the tilt sensing patterns illustrated in FIG. 11 according to an embodiment of the present disclosure.

Referring to FIG. 15, the position input device 20 may be disposed with a predetermined tilt in the x-axis direction x, which is the other side surface direction of the display panel 100, to detect infrared light reflected from any one code pattern CP and the tilt sensing patterns TIP and generate detected image data in the x-axis direction x for the code pattern CP and the tilt sensing patterns TIP.

The main processor 500 distinguishes a detected image for each of the tilt sensing patterns TIP, that is, the first to fourth sensing patterns TP1 to TP4, from the detected image data in the x-axis direction x for the code pattern CP and the tilt sensing patterns TIP. In addition, the main processor 500 corrects a size of the detected image of each of the first to fourth sensing patterns TP1 to TP4 according to a distance between the display panel 100 and the position input device 20.

The main processor 500 calculates detected areas detected differently according to amounts of reflected light from the corrected detected image of each of the first to fourth sensing patterns TP1 to TP4. As illustrated in FIG. 15, a reflection angle of the fourth sensing pattern TP4 disposed most adjacent to the position input device 20 is the smallest and loss of an amount of reflected light of the fourth sensing pattern TP4 is the smallest, such that the light amount detected area of the fourth sensing pattern TP4 may be detected to be the greatest and brightest as compared with the first to third sensing patterns TP1 to TP3. On the other hand, a reflection angle of the first sensing pattern TP1 positioned farthest from the position input device 20 is the greatest and loss of an amount of reflected light of the first sensing pattern TP1 is the greatest, such that the light amount detected area of the first sensing pattern TP1 may be detected in black to be the smallest as compared with the second to fourth sensing patterns TP2 to TP4.

The main processor 500 calculates the light amount detected areas according to amounts of reflected light from the detected image of each of the first to fourth sensing patterns TP1 to TP4, and compares the light amount detected areas of the first to fourth sensing patterns TP1 to TP4 with each other. In addition, the main processor 500 may determine the arrangement direction of the position input device 20 so as to correspond to an arrangement direction of the fourth sensing pattern TP4 calculated as having the greatest light amount detected area among the first to fourth sensing patterns TP1 to TP4.

In addition, the main processor 500 may determine the tilt of the position input device 20 according to the light amount detected area for at least one of the first to fourth sensing patterns TP1 to TP4. As an example, the main processor 500 may determine that a horizontal tilt of the position input device 20 becomes greater as the light amount detected area becomes greater, and determine that a horizontal tilt of the position input device 20 becomes smaller as the light amount detected area becomes smaller, in accordance with the light amount detected area of the fourth sensing pattern TP4 calculated as having the greatest light amount detected area among the first to fourth sensing patterns TP1 to TP4.

Figure 16:
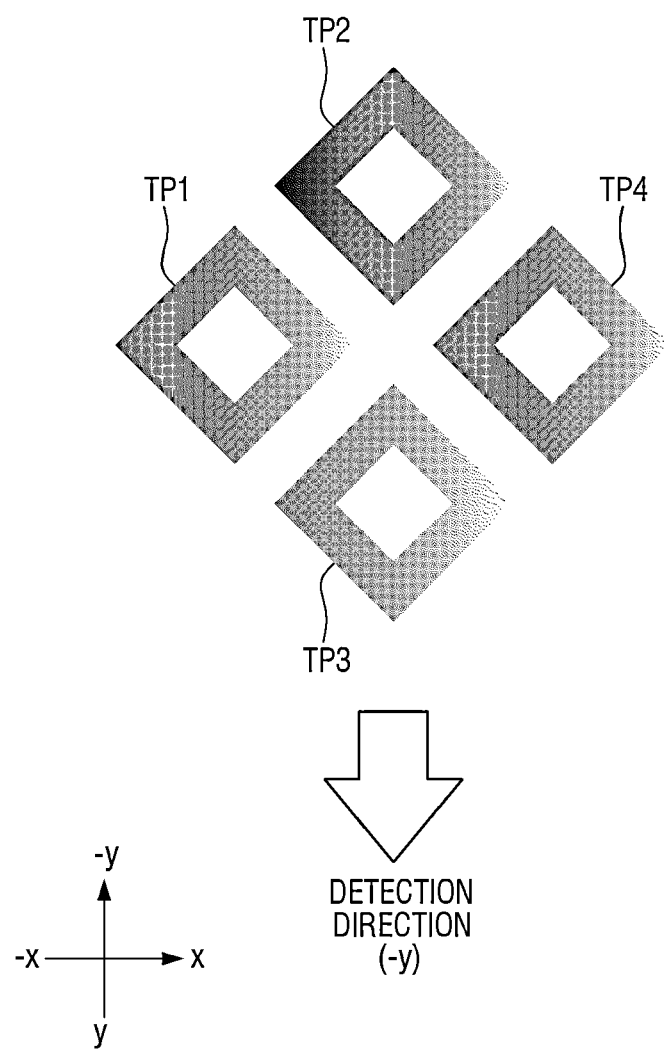
FIG. 16 is a view illustrating detected images, in a −y-axis direction, of the tilt sensing patterns illustrated in FIG. 11 according to an embodiment of the present disclosure.

FIG. 16 is a view illustrating detected images, in a −y-axis direction, of the tilt sensing patterns illustrated in FIG. 11 according to an embodiment of the present disclosure.

Referring to FIG. 16, the position input device 20 may be disposed with a predetermined tilt in the −y-axis direction −y, which is a downward direction of the display panel 100, to detect infrared light reflected from any one code pattern CP and the tilt sensing patterns TIP and generate detected image data in the −y-axis direction −y for the code pattern CP and the tilt sensing patterns TIP.

The main processor 500 distinguishes a detected image for each of the first to fourth sensing patterns TP1 to TP4 from the detected image data in the −y-axis direction −y for the code pattern CP and the tilt sensing patterns TIP. In addition, the main processor 500 corrects a size of the detected image of each of the first to fourth sensing patterns TP1 to TP4 according to a distance between the display panel 100 and the position input device 20.

The main processor 500 calculates detected areas detected differently according to amounts of reflected light from the corrected detected image of each of the first to fourth sensing patterns TP1 to TP4. The position input device 20 in the y-axis direction −y may be positioned most adjacent to the third sensing pattern TP3. Accordingly, a reflection angle of the third sensing pattern TP3 disposed most adjacent to the position input device 20 is the smallest and loss of an amount of reflected light of the third sensing pattern TP3 is the smallest, such that the light amount detected area of the third sensing pattern TP3 may be detected to be the greatest and brightest as compared with the first, second, and fourth sensing patterns TP1, TP2, and TP4. On the other hand, a reflection angle of the second sensing pattern TP2 positioned farthest from the position input device 20 is the greatest and loss of an amount of reflected light of the second sensing pattern TP2 is the greatest, such that the light amount detected area of the second sensing pattern TP2 may be detected in black to be the smallest as compared with the first, third, and fourth sensing patterns TP1, TP3, and TP4.

As such, the main processor 500 calculates the light amount detected areas according to amounts of reflected light from the detected image of each of the first to fourth sensing patterns TP1 to TP4, and compares the light amount detected areas of the first to fourth sensing patterns TP1 to TP4 with each other. In addition, the main processor 500 may determine the arrangement direction of the position input device 20 so as to correspond to an arrangement direction of the third sensing pattern TP3 calculated as having the greatest light amount detected area among the first to fourth sensing patterns TP1 to TP4.

In addition, the main processor 500 may determine that a horizontal tilt of the position input device 20 becomes greater as the light amount detected area becomes greater, and determine that a horizontal tilt of the position input device 20 becomes smaller as the light amount detected area becomes smaller, in accordance with the light amount detected area of the third sensing pattern TP3 calculated as having the greatest light amount detected area among the first to fourth sensing patterns TP1 to TP4.

Figure 17:
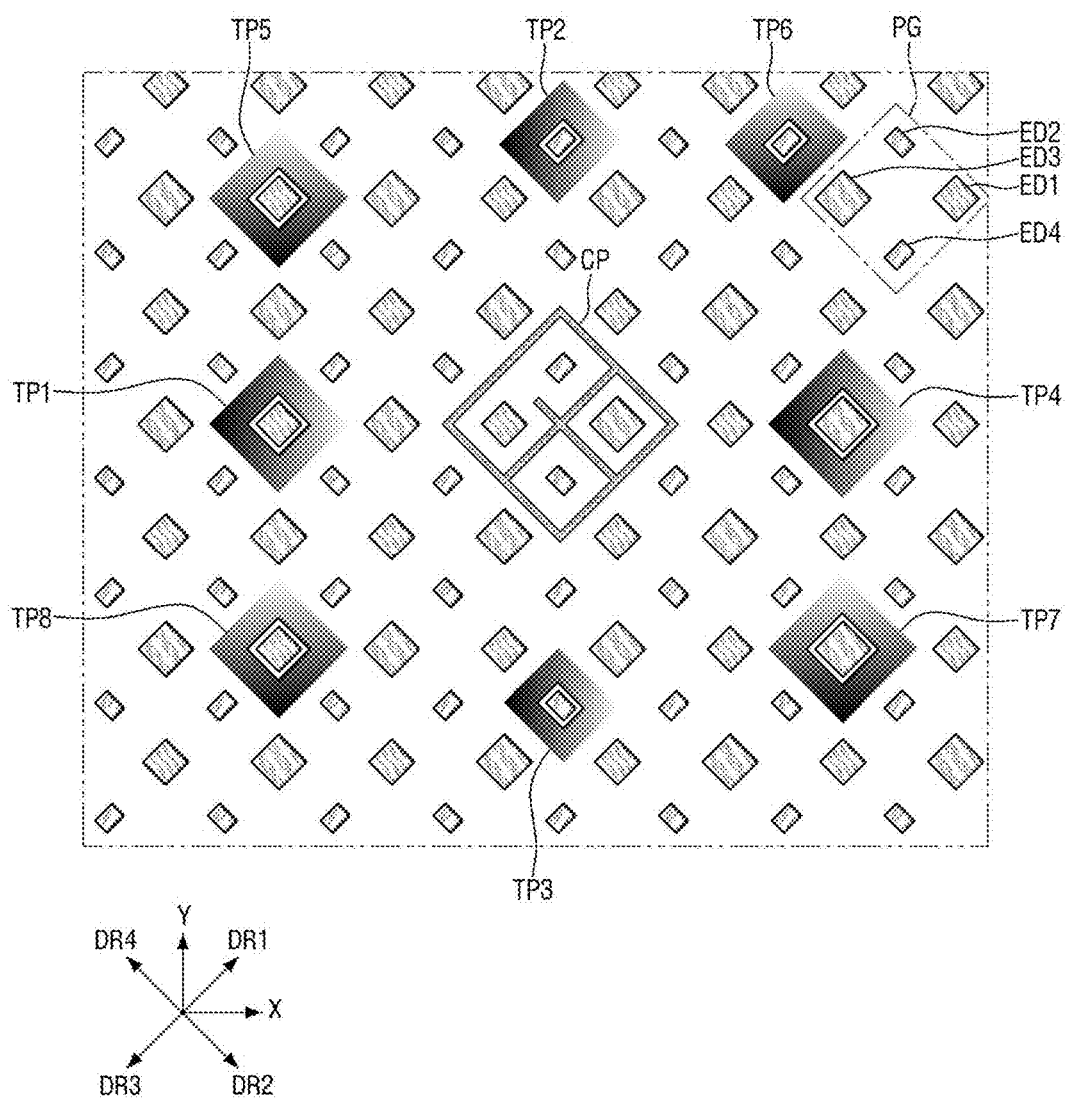
FIG. 17 is an enlarged view illustrating an arrangement structure of a code pattern and tilt sensing patterns formed in area B1 of FIG. 6 according to an embodiment of the present disclosure.

FIG. 17 is an enlarged view illustrating an arrangement structure of a code pattern and tilt sensing patterns formed in area B1 of FIG. 6 according to an embodiment.

Referring to FIG. 17, tilt sensing patterns TIP may be respectively disposed in four directions or eight directions of each code pattern CP in a plan view. As an example, the tilt sensing patterns TIP may be respectively disposed in the −x-axis direction −x and the x-axis direction x, which are horizontal directions of both sides of each of the code patterns CP, and the −y-axis direction −y and the y-axis direction y, which are upward and downward directions of each of the code patterns CP, in a plan view. In addition, the tilt sensing patterns TIP may be respectively disposed adjacent to each code pattern CP in a first diagonal direction DR4, a second diagonal direction DR1, a third diagonal direction DR2, and a fourth diagonal direction DR3 in a plan view.

The tilt sensing patterns TIP may include a first sensing pattern TP1 disposed in a horizontal direction (−x-axis direction −x) of one side of each of the code patterns CP, a second sensing pattern TP2 disposed in an upward direction (y-axis direction y) of one side of each of the code patterns CP, a third sensing pattern TP3 disposed in a downward direction (−y-axis direction) of the other side of each of the code patterns CP, and a fourth sensing pattern TP4 disposed in a horizontal direction (x-axis direction) of the other side of each of the code patterns CP.

In addition, the tilt sensing patterns TIP may further include a fifth sensing pattern TP5 disposed in the first diagonal direction DR4 of each code pattern CP, a sixth sensing pattern TP6 disposed in the second diagonal direction DR1 of each code pattern CP, a seventh sensing pattern TP7 disposed in a third diagonal direction DR2 of each code pattern CP, and an eighth sensing pattern TP8 disposed in the fourth diagonal direction DR3 of each code pattern CP.

The first to eighth sensing patterns TP1 to TP8 are respectively disposed in at least four directions of each code pattern CP, such that the first to eighth sensing patterns TP1 to TP8 disposed around the code patterns CP may be detected together with the code patterns CP when the code patterns CP are detected by the position input device 20 in a front surface or any one side surface direction.

Figure 18:
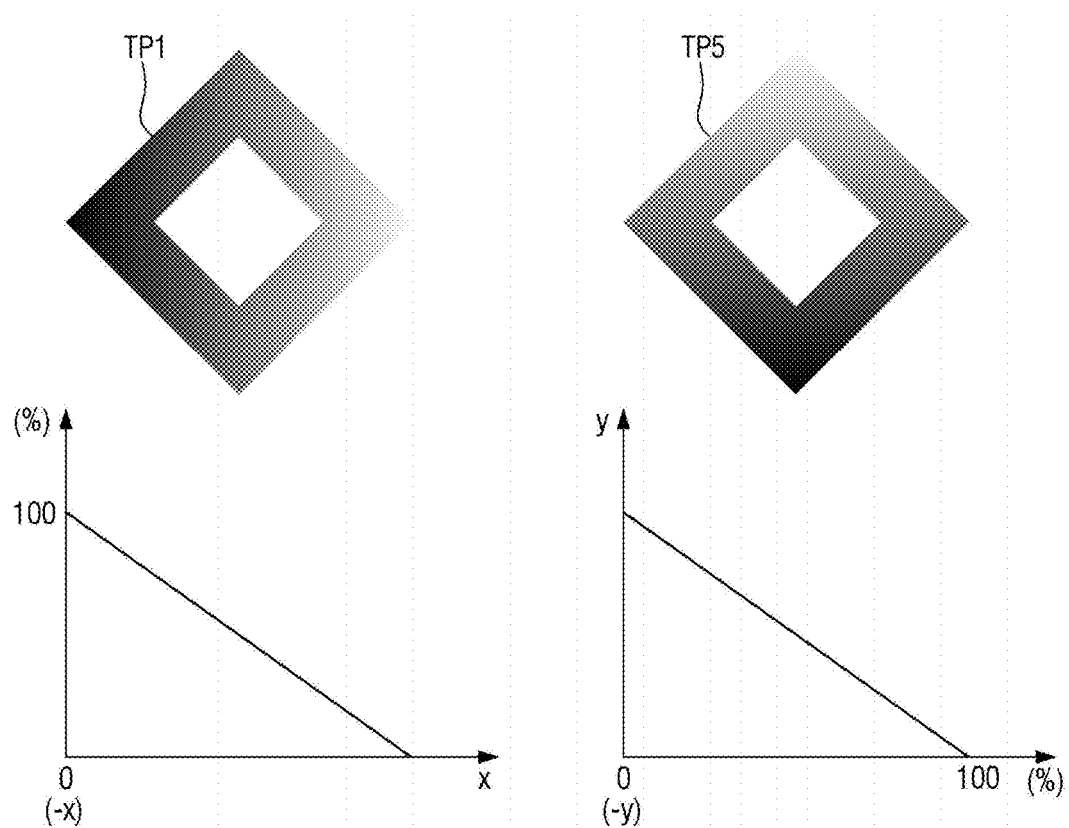
FIG. 18 is a view for describing distributions of absorbents in different tilt sensing patterns illustrated in FIG. 17 according to an embodiment of the present disclosure.

FIG. 18 is a view for describing distributions of absorbents in different tilt sensing patterns illustrated in FIG. 17 according to an embodiment of the present disclosure.

Referring to FIG. 18, each of light blocking members forming the first to eighth sensing patterns TP1 to TP8 may be formed by including an absorbent in a preset amount in a coating member made of an organic or inorganic material.

The content of the absorbent included in the light blocking member forming each of the first to eighth sensing patterns TP1 to TP8, that is, the coating member, may be the highest in any one side direction and gradually decrease from any one side direction to the other side direction opposite to any one side direction. As an example, as illustrated in FIG. 18, a content of an absorbent included in a light blocking member forming each of the first to fourth sensing patterns TP1 to TP4 may gradually decrease according to a preset ratio from the −x-axis direction −x, which is a horizontal direction of one side, to the x-axis direction x, which is a horizontal direction of the other side. The content of the absorbent included in the light blocking member may gradually decrease from about 100% in one side direction to about 0% in the other side direction.

To the contrary, a content of an absorbent included in a light blocking member forming each of the fifth and eighth sensing patterns TP5 to TP8 may gradually decrease according to a preset ratio from the −y-axis direction −y, which is a downward direction of one side, to the y-axis direction x, which is an upward direction of the other side. The content of the absorbent included in the light blocking member may gradually decrease from about 100% in the downward direction of one side to about 0% in the upward direction of the other side. As such, the content of the absorbent included in each of the tilt sensing patterns TIP gradually increases or decreases in at least one direction, such that differences in absorption amount, reflectivity, etc., of the infrared light may become clearer for each direction according to the arrangement direction and the tilt of the position input device 20.

Figure 19:
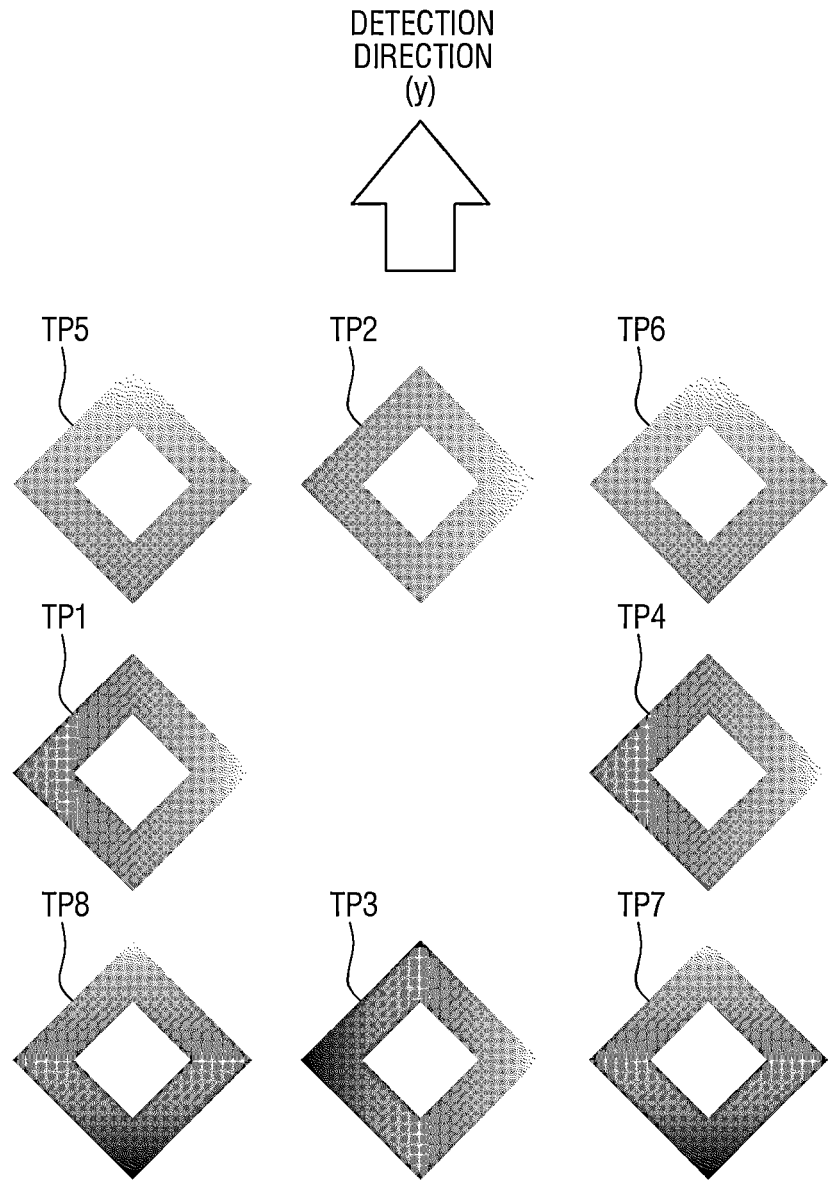
FIG. 19 is a view illustrating detected images, in a y-axis direction, of the tilt sensing patterns illustrated in FIG. 17 according to an embodiment of the present disclosure.

FIG. 19 is a view illustrating detected images, in the y-axis direction, of the tilt sensing patterns illustrated in FIG. 17 according to an embodiment of the present disclosure.

As illustrated in FIG. 19, the position input device 20 may be disposed in a front surface direction of any one code pattern CP and the first to eighth sensing patterns TP1 to TP8 to generate detected image data for the code pattern CP and the first to eighth sensing patterns TP1 to TP8.

In addition, the position input device 20 may generate detected image data for the code pattern CP and the first to eighth sensing patterns TP1 to TP8 in the y-axis direction y, which is the upward direction. Accordingly, the main processor 500 may distinguish a detected image for each of the first to eighth sensing patterns TP1 to TP8 from the detected image data.

The main processor 500 corrects a size of the detected image of each of the first to eighth sensing patterns TP1 to TP8 according to a distance between the display panel 100 and the position input device 20, and calculates detected areas detected differently according to amounts of reflected light from the detected image of each of the first to eighth sensing patterns TP1 to TP8.

As illustrated in FIG. 19, when the first to eighth sensing patterns TP1 to TP8 are detected in the y-axis direction y, which is the upward direction, reflection angles of the second sensing pattern TP2 disposed most adjacent to the position input device 20 and the first and sixth sensing patterns TP1 and TP6 are the smallest and loss of amounts of reflected light of the second sensing pattern TP2 and the first and sixth sensing patterns TP1 and TP6 is the smallest, such that the light amount detected areas of the second sensing pattern TP2 and the first and sixth sensing patterns TP1 and TP6 may be detected to be the greatest and brightest as compared with the other sensing patterns. On the other hand, reflection angles of the seventh and eighth sensing patterns TP7 and TP8 positioned farthest from the position input device 20 and the third sensing pattern TP3 are the greatest and loss of amounts of reflected light of the seventh and eighth sensing patterns TP7 and TP8 and the third sensing pattern TP3 is the greatest, such that the light amount detected areas of the seventh and eighth sensing patterns TP7 and TP8 and the third sensing pattern TP3 may be detected to be the smallest and dark as compared with the other sensing patterns. Accordingly, the main processor 500 may compare the light amount detected areas of the first to eighth sensing patterns TP1 to TP8 with each other and determine the arrangement direction of the position input device 20 so as to correspond to an arrangement direction of the second sensing pattern TP2 calculated as having the greatest light amount detected area.

In addition, the main processor 500 may determine that a horizontal tilt of the position input device 20 becomes greater as the light amount detected area becomes greater and determine that a horizontal tilt of the position input device 20 becomes smaller as the light amount detected area becomes smaller, in accordance with the light amount detected area of the second sensing pattern TP2 calculated as having the greatest light amount detected area among the first to eighth sensing patterns TP1 to TP8.

Figure 20:
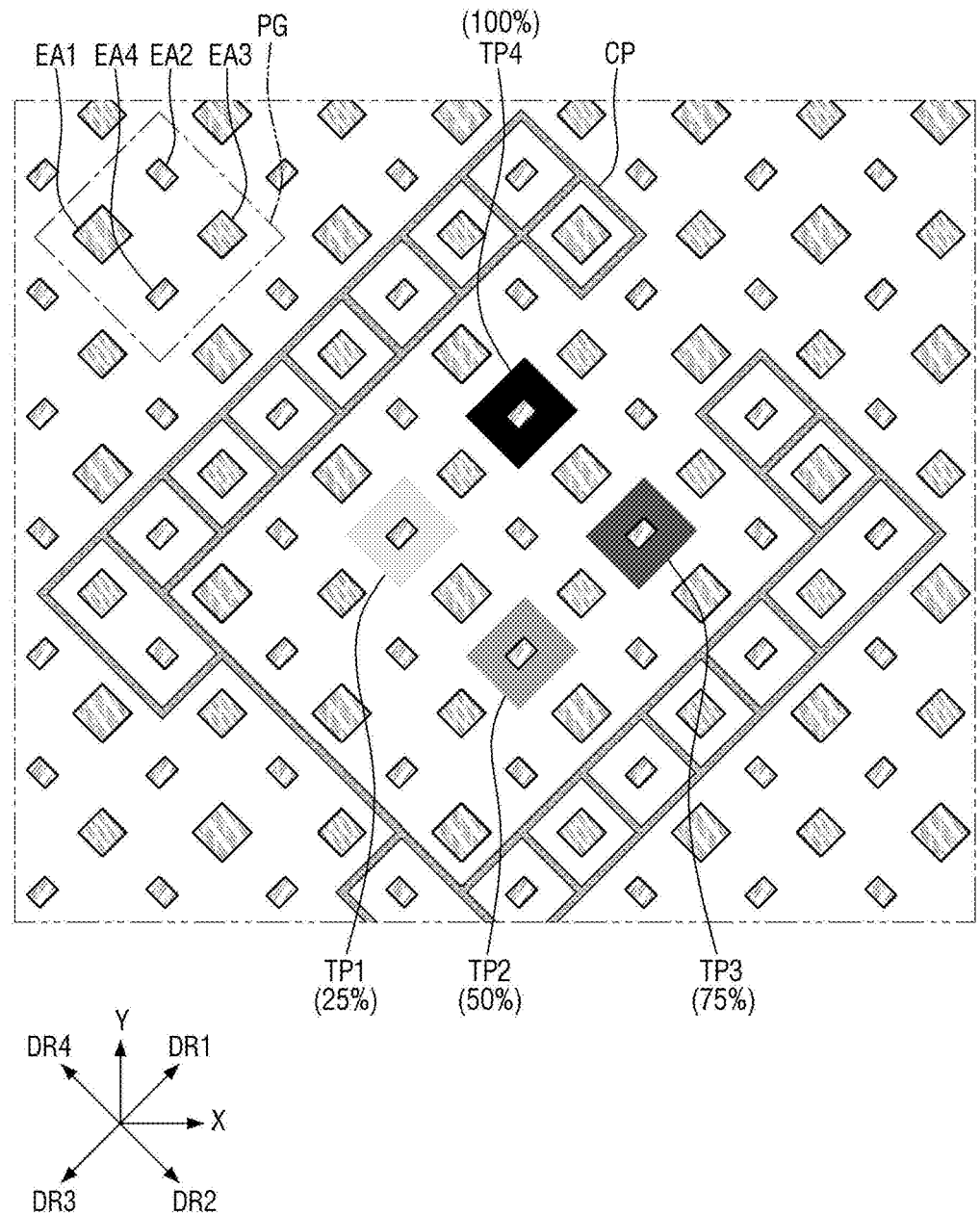
FIG. 20 is an enlarged view illustrating an arrangement structure of a code pattern and tilt sensing patterns formed in area B1 of FIG. 6 according to an embodiment of the present disclosure.
Figure 21:
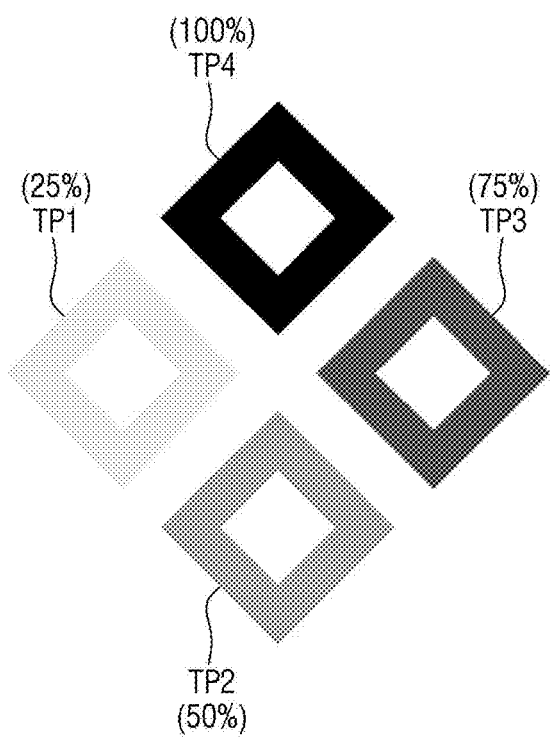
FIG. 21 is a view illustrating contents of absorbents of respective tilt sensing patterns illustrated in FIG. 20 according to an embodiment of the present disclosure.

FIG. 20 is an enlarged view illustrating an arrangement structure of a code pattern and tilt sensing patterns formed in area B1 of FIG. 6 according to an embodiment of the present disclosure. FIG. 21 is a view illustrating contents of absorbents of respective tilt sensing patterns illustrated in FIG. 20 according to an embodiment of the present disclosure.

Referring to FIG. 20, tilt sensing patterns TIP, for example, first to fourth sensing patterns TP1 to TP4, may be respectively disposed in an inner area of each code pattern CP. The first to fourth sensing patterns TP1 to TP4 may be disposed in a shape in which they are surrounded by each code pattern CP in a plan view.

The first to fourth sensing patterns TP1 to TP4 are respectively disposed in each of the code patterns CP, such that the tilt sensing patterns TIP disposed in the code patterns CP may be detected together with the code patterns CP when the code patterns CP are detected by the position input device 20 in a front surface or any one side surface direction.

As illustrated in FIG. 21, contents of absorbents included in the respective sensing patterns, for example, the first to fourth sensing patterns TP1 to TP4, included in the tilt sensing patterns TIP may be the same as or different from each other.

The contents of the absorbents included in the first to fourth sensing patterns TP1 to TP4 may be about 25%, about 50%, about 75%, and about 100%, respectively. For example, the tilt sensing patterns TIP may include the first sensing pattern TP1 in which the content of the absorbent included in the light blocking member is about 25%, the second sensing pattern TP2 in which the content of the absorbent included in the light blocking member is about 50%, the third sensing pattern TP3 in which the content of the absorbent included in the light blocking member is about 75%, and the fourth sensing pattern TP4 in which the content of the absorbent included in the light blocking member is about 100%.

The respective sensing patterns TP1 to TP4 including the absorbents in different amounts may be arranged around or in each code pattern CP in a plan view according to a preset arrangement order or pattern. For example, the first sensing pattern TP1 in which the content of the absorbent is about 25% may be disposed in a horizontal direction (−x-axis direction −x) of one side of each code pattern CP, and the fourth sensing pattern TP4 in which the content of the absorbent is about 100% may be disposed in an upward direction (y-axis direction y) of one side of each code pattern CP. In addition, the second sensing pattern TP2 in which the content of the absorbent is about 50% may be disposed in a downward direction (−y-axis direction) of the other side of each code pattern CP, and the third sensing pattern TP3 in which the content of the absorbent is about 75% may be disposed in a horizontal direction (x-axis direction) of the other side of each code pattern CP.

The position input device 20 may be disposed in a front surface direction of the display panel 100 to detect infrared light reflected from any one code pattern CP and the tilt sensing patterns TIP on a front surface, and generate detected image data in the front surface direction for the code pattern CP and the tilt sensing patterns TIP. In addition, the main processor 500 or the code processor 23 may distinguish detected images for the tilt sensing patterns TIP, that is, the first to fourth sensing patterns TP1 to TP4, from the detected image data in the front surface direction.

The main processor 500 detects luminance values according to amounts of reflected light from the detected image of each of the first to fourth sensing patterns TP1 to TP4.

In a state in which the position input device 20 is disposed on a front surface (e.g., tilt of about 80° to about 100°), the first sensing pattern TP1 may be detected as a first luminance image in which a first luminance value is positioned by the content (about 25%) of the absorbent. In addition, the second sensing pattern TP2 may be detected as a second luminance image in which a second luminance value lower than the first luminance value is positioned by the content (about 50%) of the absorbent. In addition, the third sensing pattern TP3 may be detected as a third luminance image in which a third luminance value lower than the second luminance value is positioned by the content (about 75%) of the absorbent. In addition, the fourth sensing pattern TP4 may be detected as a fourth luminance image in which a fourth luminance value lower than the third luminance value is positioned by the content (about 100%) of the absorbent.

The main processor 500 may set luminance detected images and the first to fourth luminance values of the first to fourth sensing patterns TP1 to TP4 detected in the front surface direction as reference luminance detected images and first to fourth reference luminance values.

Accordingly, when first to fourth luminance values for the first to fourth sensing patterns TP1 to TP4 detected at any one point in time are the same as the first to fourth reference luminance values or similar to the first to fourth reference luminance values within reference error ranges, the main processor 500 may determine the arrangement direction of the position input device 20 as the front surface direction and the tilt of the position input device 20 as being substantially perpendicular to the front surface direction.

In embodiments, the luminance detected images and the first to fourth luminance values for the first to fourth sensing patterns TP1 to TP4 may be detected differently according to the arrangement direction and the tilt of the position input device 20. As an example, as an amount of absorbed infrared light and an amount of lost light decrease according to the arrangement direction and the tilt of the position input device 20, an amount of light received by the position input device 20 may increase and a detected luminance value may increase. To the contrary, as the amount of absorbed infrared light and the amount of lost light increase, the amount of light received by the position input device 20 may decrease and the detected luminance value may decrease.

Figure 22:
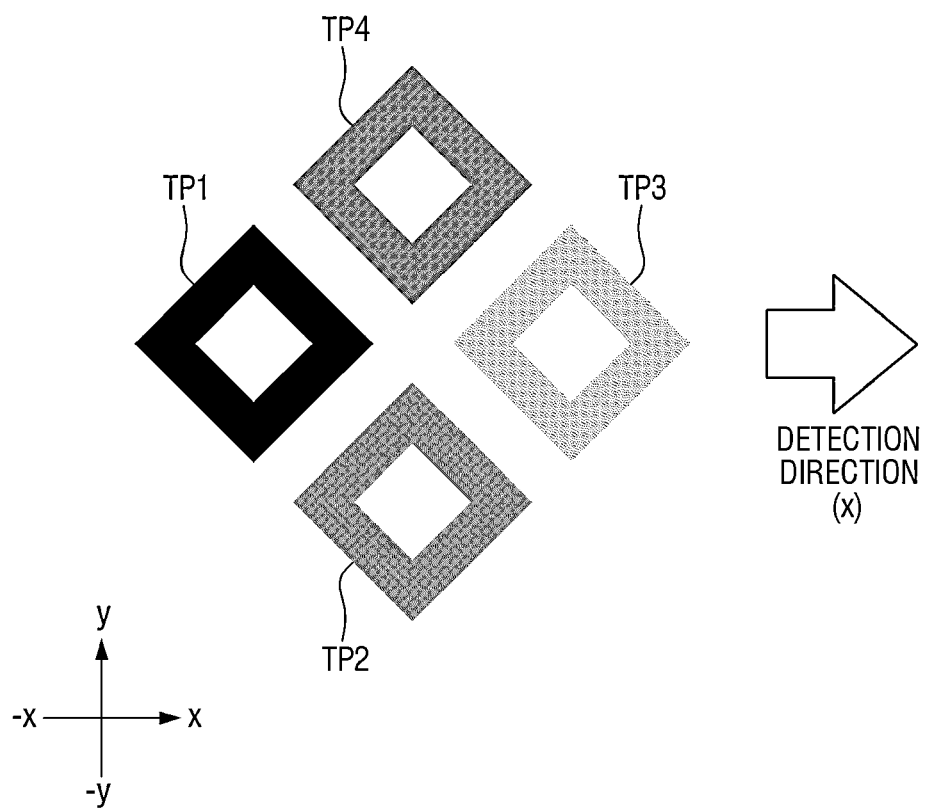
FIG. 22 is a view illustrating detected images, in the x-axis direction, of the tilt sensing patterns illustrated in FIG. 21 according to an embodiment of the present disclosure.

FIG. 22 is a view illustrating detected images, in the x-axis direction, of the tilt sensing patterns illustrated in FIG. 21 according to an embodiment of the present disclosure.

Referring to FIG. 22, the position input device 20 may be disposed with a predetermined tilt in the x-axis direction x, which is any one side surface direction, to generate detected image data for any one code pattern CP and the tilt sensing patterns TIP. In addition, the main processor 500 may distinguish luminance detected image data corresponding to the tilt sensing patterns TIP from the detected image data.

The main processor 500 detects the first to fourth luminance values from the luminance detected images of the first to fourth sensing patterns TP1 to TP4 detected at any one point in time. In this case, the first to fourth luminance values are detected differently according to amounts of reflected light. In addition, the main processor 500 compares and calculates the first to fourth luminance values for the first to fourth sensing patterns TP1 to TP4 with preset first to fourth reference luminance values, respectively.

The main processor 500 detects one sensing pattern detected as having a luminance value that is the highest (or the brightest) as compared with the first to fourth reference luminance values among the first to fourth luminance values for the first to fourth sensing patterns TP1 to TP4. In addition, the main processor 500 may determine the arrangement direction of the position input device 20 so as to correspond to an arrangement direction of one sensing pattern detected as having the luminance value that is the highest.

In addition, the main processor 500 may determine a horizontal tilt of the position input device 20 according to a luminance difference value of a sensing pattern detected as having a luminance value that is the highest as compared with any one reference luminance value. For example, the main processor 500 may determine the horizontal tilt of the position input device 20 according to a difference value between any one reference luminance value and a luminance value detected to be the highest as compared with any one reference luminance value. For example, the main processor 500 may determine that the horizontal tilt of the position input device 20 becomes greater as a difference value between any one of the first to fourth reference luminance values and a luminance value that is the highest as compared with any one reference luminance value among the first to fourth luminance values becomes greater, and determine that the horizontal tilt of the position input device 20 becomes smaller as the difference value becomes smaller.

Referring to FIG. 21, the main processor 500 may detect the third sensing pattern TP3 detected as having a luminance value that is the highest as compared with the first to fourth reference luminance values among the first to fourth luminance values for the first to fourth sensing patterns TP1 to TP4. In addition, the main processor 500 may determine the arrangement direction of the position input device 20 so as to correspond to an arrangement direction (x-axis direction) of the third sensing pattern TP3 detected as having the luminance value that is the highest.

In addition, the main processor 500 may determine the horizontal tilt of the position input device 20 according to a difference value between any one of the first to fourth reference luminance values and a luminance value that is the highest as compared with any one reference luminance value. For example, the main processor 500 may determine that the horizontal tilt of the position input device 20 becomes greater as a difference value between any one of the first to fourth reference luminance values and the luminance value that is the highest as compared with any one reference luminance value becomes greater, and determine that the horizontal tilt of the position input device 20 becomes smaller as the difference value becomes smaller. Alternately, the main processor 500 may determine that the horizontal tilt of the position input device 20 becomes smaller as a difference value between any one of the first to fourth reference luminance values and the luminance value that is the highest as compared with any one reference luminance value becomes greater, and determine that the horizontal tilt of the position input device 20 becomes greater as the difference value becomes smaller.

Figure 23:
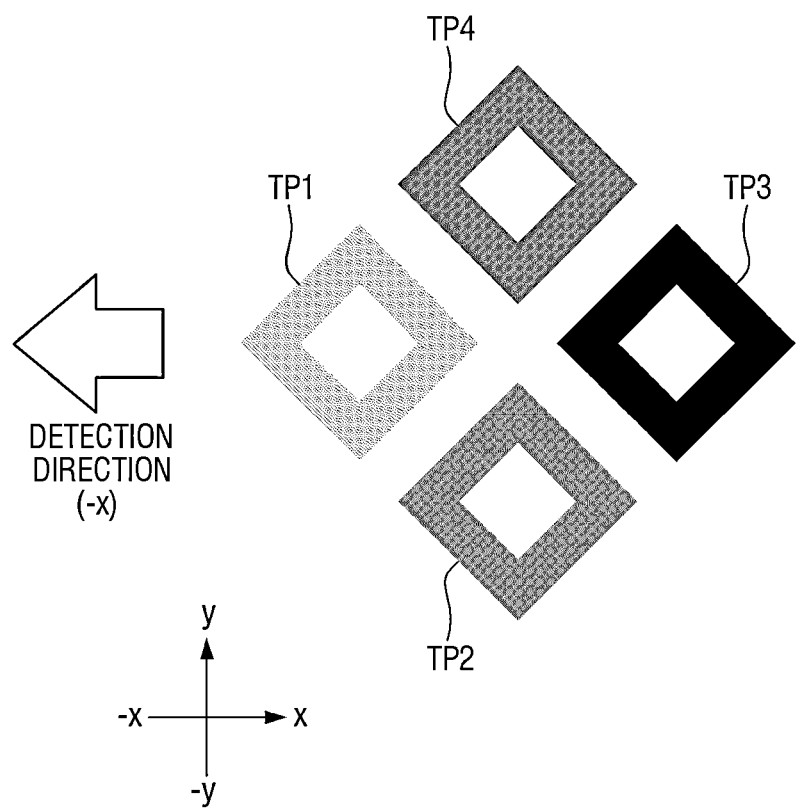
FIG. 23 is a view illustrating detected images, in the −x-axis direction, of the tilt sensing patterns illustrated in FIG. 21 according to an embodiment of the present disclosure.

FIG. 23 is a view illustrating detected images, in the −x-axis direction, of the tilt sensing patterns illustrated in FIG. 21 according to an embodiment of the present disclosure.

Referring to FIG. 23, the position input device 20 may be disposed with a predetermined tilt in the −x-axis direction −x to generate detected image data for the code pattern CP and the tilt sensing patterns TIP. In addition, the main processor 500 may distinguish luminance detected image data corresponding to the tilt sensing patterns TIP from the detected image data.

The main processor 500 detects the first to fourth luminance values from the luminance detected images of the first to fourth sensing patterns TP1 to TP4, respectively. The main processor 500 compares and calculates the first to fourth luminance values detected from the luminance detected image of the first to fourth sensing patterns TP1 to TP4 with the first to fourth reference luminance values, respectively.

The main processor 500 detects one sensing pattern detected as having a luminance value that is the highest as compared with the first to fourth reference luminance values among the first to fourth luminance values for the first to fourth sensing patterns TP1 to TP4. In this case, the main processor 500 may determine the arrangement direction of the position input device 20 so as to correspond to an arrangement direction (−x-axis direction) of the first sensing pattern TP1 detected as having the luminance value that is the highest.

In addition, the main processor 500 may determine the horizontal tilt of the position input device 20 according to a difference value between any one of the first to fourth reference luminance values and a luminance value that is the highest as compared with any one reference luminance value. For example, the main processor 500 may determine that the horizontal tilt of the position input device 20 becomes greater as a difference value between the first reference luminance value and the first luminance value that is the highest as compared with the first reference luminance value becomes greater, and determine that the horizontal tilt of the position input device 20 becomes smaller as the difference value becomes smaller.

Figure 24:
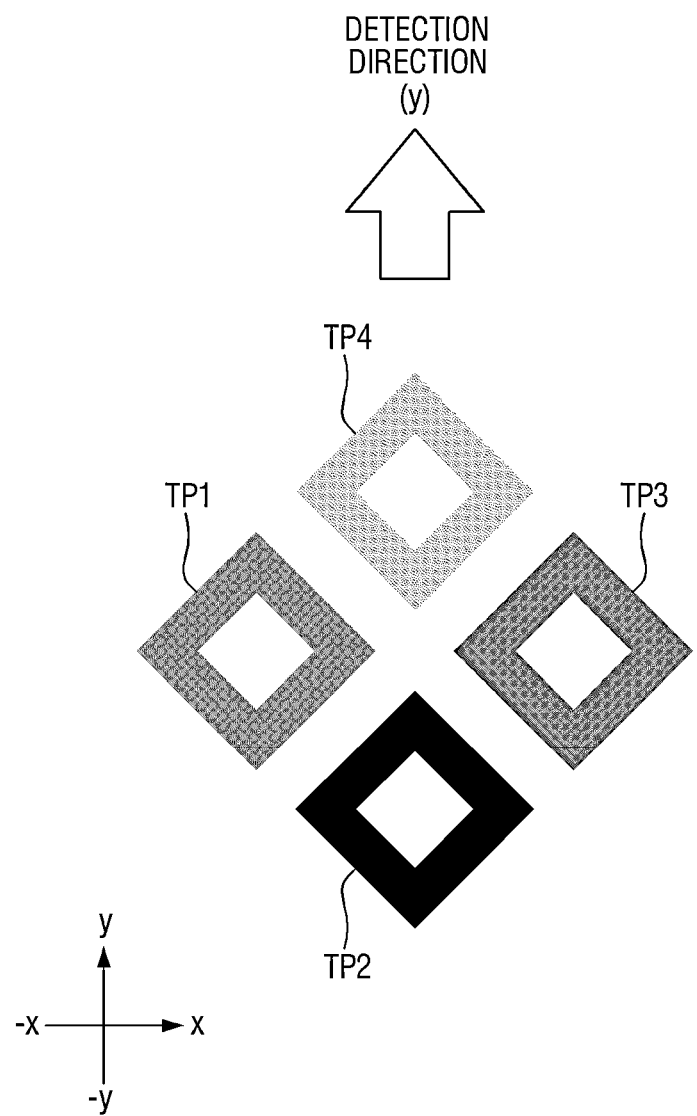
FIG. 24 is a view illustrating detected images, in the y-axis direction, of the tilt sensing patterns illustrated in FIG. 21 according to an embodiment of the present disclosure.

FIG. 24 is a view illustrating detected images, in the y-axis direction, of the tilt sensing patterns illustrated in FIG. 21 according to an embodiment of the present disclosure.

Referring to FIG. 24, the position input device 20 may be disposed with a predetermined tilt in the y-axis direction y to generate detected image data for the code pattern CP and the tilt sensing patterns TIP. In addition, the main processor 500 may distinguish luminance detected image data corresponding to the tilt sensing patterns TIP from the detected image data.

The main processor 500 detects the first to fourth luminance values from the luminance detected images of the first to fourth sensing patterns TP1 to TP4, respectively. The main processor 500 compares and calculates the first to fourth luminance values with the first to fourth reference luminance values, respectively.

The main processor 500 detects the fourth sensing pattern TP4 detected as having a luminance value that is the highest as compared with the first to fourth reference luminance values among the first to fourth luminance values. In this case, the main processor 500 may determine the arrangement direction of the position input device 20 so as to correspond to an arrangement direction (y-axis direction) of the fourth sensing pattern TP4 detected as having the luminance value that is the highest.

In addition, the main processor 500 may determine the horizontal tilt of the position input device 20 according to a difference value between the fourth reference luminance value and the fourth luminance value that is the highest as compared with the fourth reference luminance value. For example, the main processor 500 may determine that the horizontal tilt of the position input device 20 becomes greater as a difference value between the fourth reference luminance value and the fourth luminance value that is the highest as compared with the fourth reference luminance value becomes greater, and determine that the horizontal tilt of the position input device 20 becomes smaller as the difference value becomes smaller.

Figure 25:
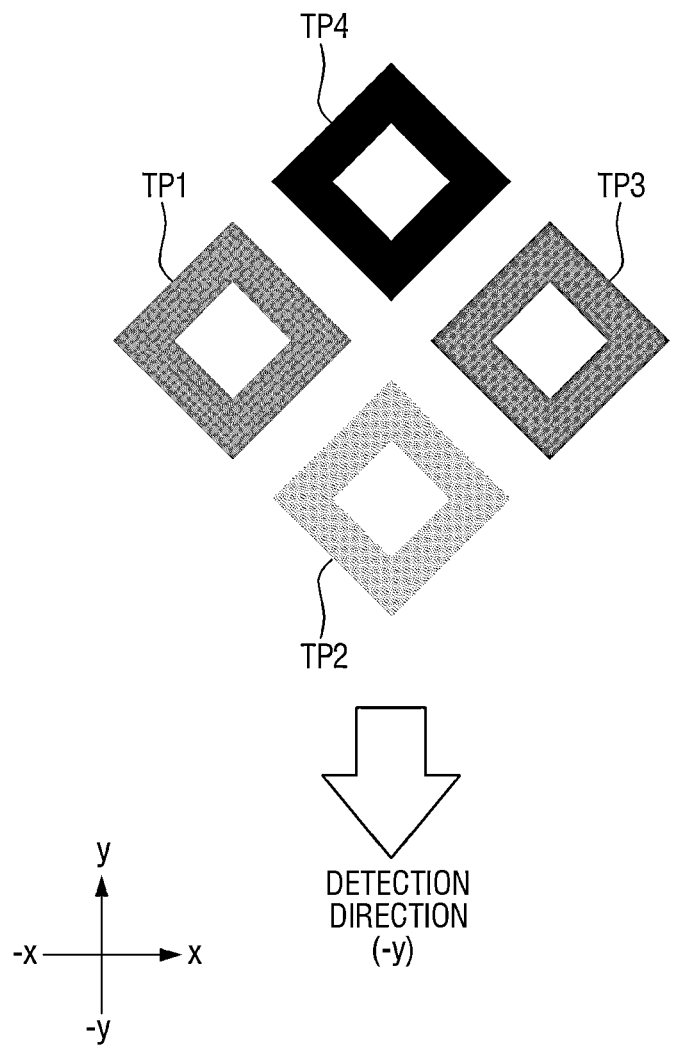
FIG. 25 is a view illustrating detected images, in the −y-axis direction, of the tilt sensing patterns illustrated in FIG. 21 according to an embodiment of the present disclosure.

FIG. 25 is a view illustrating detected images, in the −y-axis direction, of the tilt sensing patterns illustrated in FIG. 21 according to an embodiment of the present disclosure.

Referring to FIG. 25, the position input device 20 may be disposed with a predetermined tilt in the −y-axis direction −y to generate detected image data for the code pattern CP and the tilt sensing patterns TIP. In addition, the main processor 500 may distinguish luminance detected image data corresponding to the tilt sensing patterns TIP from the detected image data. In this case, the main processor 500 detects the first to fourth luminance values from the luminance detected images of the first to fourth sensing patterns TP1 to TP4, respectively. In addition, the main processor 500 compares and calculates the first to fourth luminance values with the first to fourth reference luminance values, respectively.

The main processor 500 detects the second sensing pattern TP2 detected as having a luminance value that is the highest as compared with the first to fourth reference luminance values among the first to fourth luminance values. In this case, the main processor 500 may determine the arrangement direction of the position input device 20 so as to correspond to an arrangement direction (y-axis direction) of the second sensing pattern TP2 detected as having the luminance value that is the highest.

In addition, the main processor 500 may determine that the horizontal tilt of the position input device 20 becomes greater as a difference value between the second reference luminance value and the second luminance value that is the highest as compared with the second reference luminance value becomes greater, and determine that the horizontal tilt of the position input device 20 becomes smaller as the difference value becomes smaller.

Figure 26:
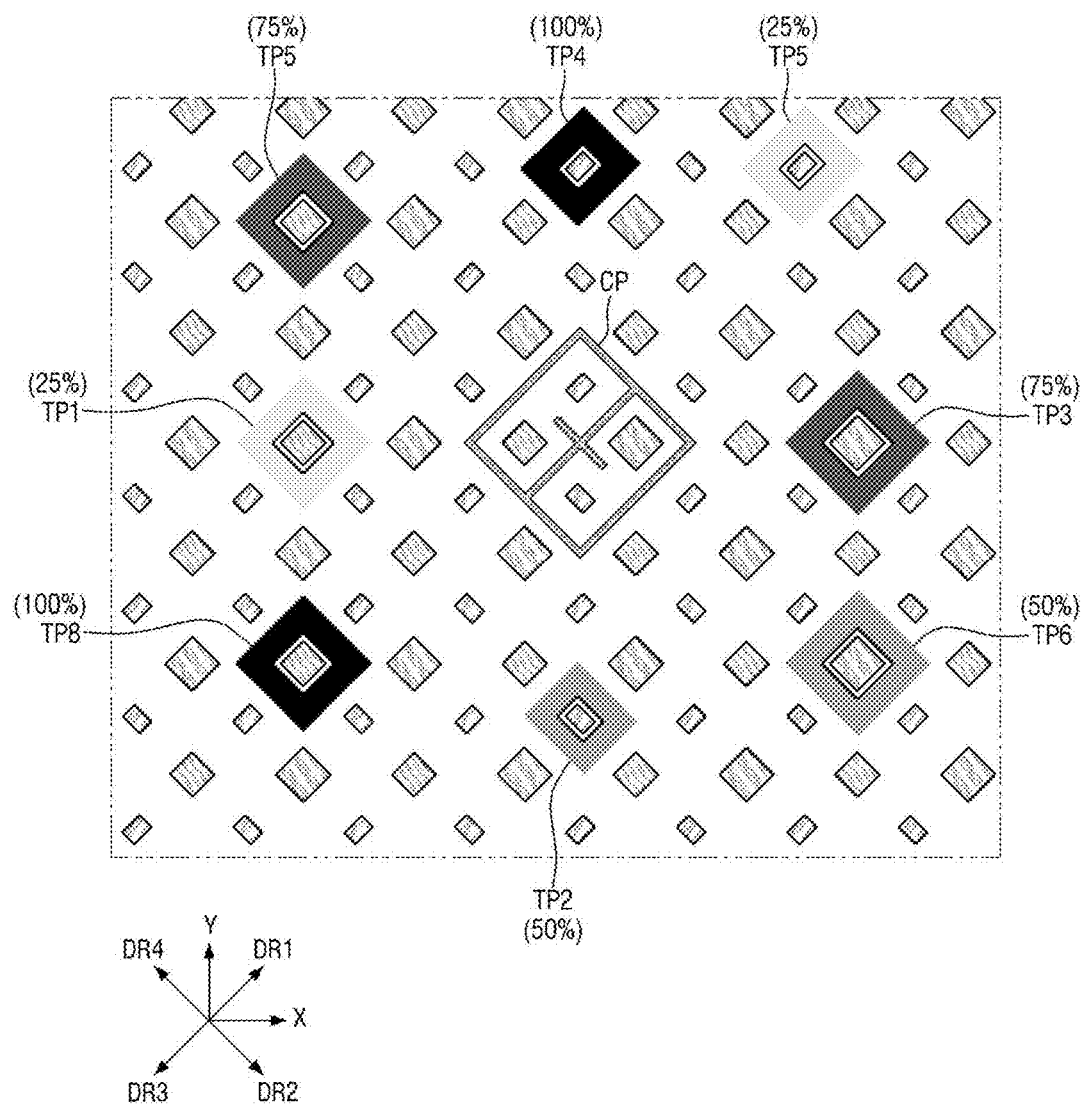
FIG. 26 is an enlarged view illustrating an arrangement structure of a code pattern and tilt sensing patterns formed in area B1 of FIG. 6 according to an embodiment of the present disclosure.
Figure 27:
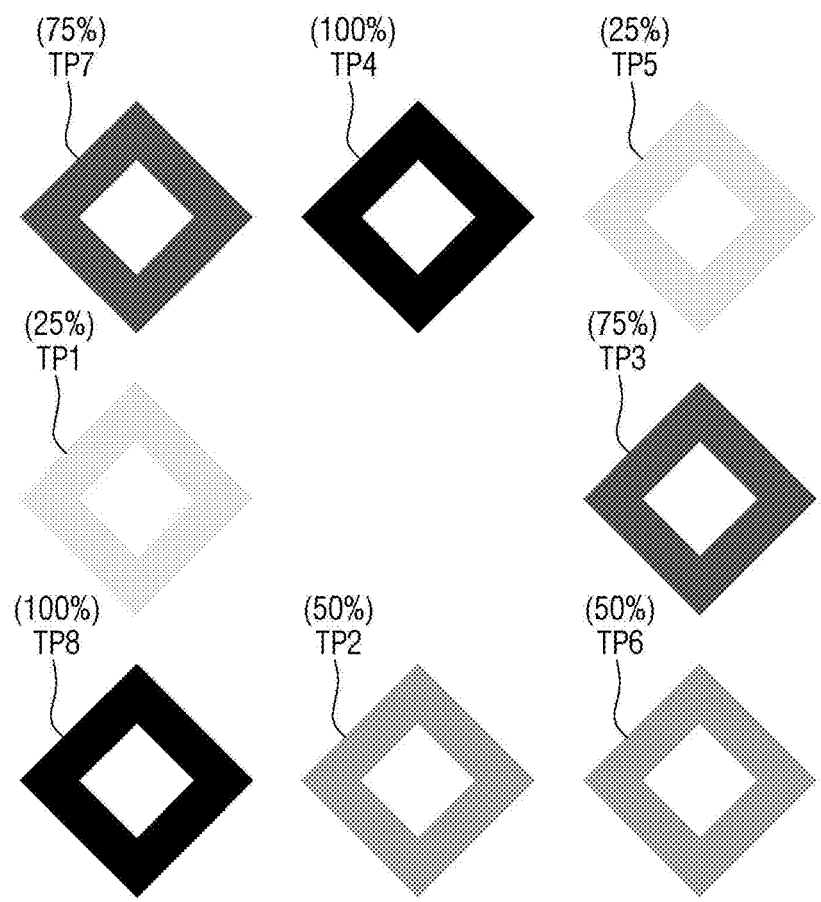
FIG. 27 is a view illustrating contents of absorbents of respective tilt sensing patterns illustrated in FIG. 26 according to an embodiment of the present disclosure.

FIG. 26 is an enlarged view illustrating an arrangement structure of a code pattern and tilt sensing patterns formed in area B1 of FIG. 6 according to an embodiment of the present disclosure. FIG. 27 is a view illustrating contents of absorbents of respective tilt sensing patterns illustrated in FIG. 26 according to an embodiment of the present disclosure.

Referring to FIG. 26, tilt sensing patterns TIP, for example, first to eighth sensing patterns TP1 to TP8, may be respectively disposed around each code pattern CP so as to surround each code pattern CP, in a plan view. Contents of absorbents included in the first to eighth sensing patterns TP1 to TP8 may be the same as or different from each other.

The contents of the absorbents included in the first to eighth sensing patterns TP1 to TP8 may be about 25%, about 50%, about 75%, and about 100%, respectively. For example, the tilt sensing patterns TIP may include the first and fifth sensing patterns TP1 and TP5 in which the contents of the absorbents included in the light blocking members are about 25%, the second and sixth sensing patterns TP2 and TP6 in which the contents of the absorbents included in the light blocking members are about 50%, the third and seventh sensing patterns TP3 and TP7 in which the contents of the absorbents included in the light blocking members are about 75%, and the fourth and eighth sensing patterns TP4 and TP8 in which the contents of the absorbents included in the light blocking members are about 100%.

The respective sensing patterns TP1 to TP8 including the absorbents in different amounts may be arranged around or in each code pattern CP in a plan view according to a preset arrangement order or pattern. For example, the first sensing pattern TP1 in which the content of the absorbent is about 25% may be disposed in a horizontal direction (−x-axis direction −x) of one side of each code pattern CP, and the fourth sensing pattern TP4 in which the content of the absorbent is about 100% may be disposed in an upward direction (y-axis direction y) of one side of each code pattern CP. In addition, the second sensing pattern TP2 in which the content of the absorbent is about 50% may be disposed in a downward direction (−y-axis direction) of the other side of each code pattern CP, and the third sensing pattern TP3 in which the content of the absorbent is about 75% may be disposed in a horizontal direction (x-axis direction) of the other side of each code pattern CP.

In addition, the seventh sensing pattern TP7 in which the content of the absorbent is about 75% may be disposed in the first diagonal direction DR4 of each code pattern CP, and the fifth sensing pattern TP5 in which the content of the absorbent is about 25% may be disposed in the second diagonal direction DR1 of each code pattern CP. In addition, the eighth sensing pattern TP8 in which the content of the absorbent is about 100% may be disposed in the fourth diagonal direction DR3 of each code pattern CP, and the sixth sensing pattern TP6 in which the content of the absorbent is about 50% may be disposed in the second diagonal direction DR1 of each code pattern CP.

Referring to FIG. 27, the position input device 20 may be disposed in the front surface direction of the display panel 100 to generate detected image data in the front surface direction for the code pattern CP and the tilt sensing patterns TIP. In addition, the main processor 500 or the code processor 23 may distinguish detected images for the tilt sensing patterns TIP, that is, the first to eighth sensing patterns TP1 to TP8, from the detected image data in the front surface direction.

The main processor 500 detects luminance values according to amounts of reflected light from the detected image of each of the first to eighth sensing patterns TP1 to TP8. In a state in which the position input device 20 is disposed on a front surface (e.g., tilt of about 80° to about 100°), the first and fifth sensing patterns TP1 and TP5 may be detected as a first luminance image in which a first luminance value is positioned by the content (about 25%) of the absorbent. In addition, the second and sixth sensing patterns TP2 and TP6 may be detected as a second luminance image in which a second luminance value lower than the first luminance value is positioned by the content (about 50%) of the absorbent. In addition, the third and seventh sensing patterns TP3 and TP7 may be detected as a third luminance image in which a third luminance value lower than the second luminance value is positioned by the content (about 75%) of the absorbent. In addition, the fourth and eighth sensing patterns TP4 and TP8 may be detected as a fourth luminance image in which a fourth luminance value lower than the third luminance value is positioned by the content (about 100%) of the absorbent.

The main processor 500 may set luminance detected images and the first to eighth luminance values of the first to eighth sensing patterns TP1 to TP8 detected in the front surface direction as reference luminance detected images and first to eighth reference luminance values. Accordingly, when first to eighth luminance values for the first to eighth sensing patterns TP1 to TP8 detected at any one point in time are the same as the first to eighth reference luminance values or similar to the first to eighth reference luminance values within reference error ranges, the main processor 500 may determine the arrangement direction of the position input device 20 as the front surface direction and the tilt of the position input device 20 as being substantially perpendicular to the front surface direction.

In embodiments, the luminance detected images and the first to eighth luminance values for the first to eighth sensing patterns TP1 to TP8 may be detected differently according to the arrangement direction and the tilt of the position input device 20. As an example, as an amount of absorbed infrared light and an amount of lost light decrease according to the arrangement direction and the tilt of the position input device 20, an amount of light received by the position input device 20 may increase and a detected luminance value may increase. To the contrary, as the amount of absorbed infrared light and the amount of lost light increases, the amount of light received by the position input device 20 may decrease and the detected luminance value may decrease.

Figure 28:
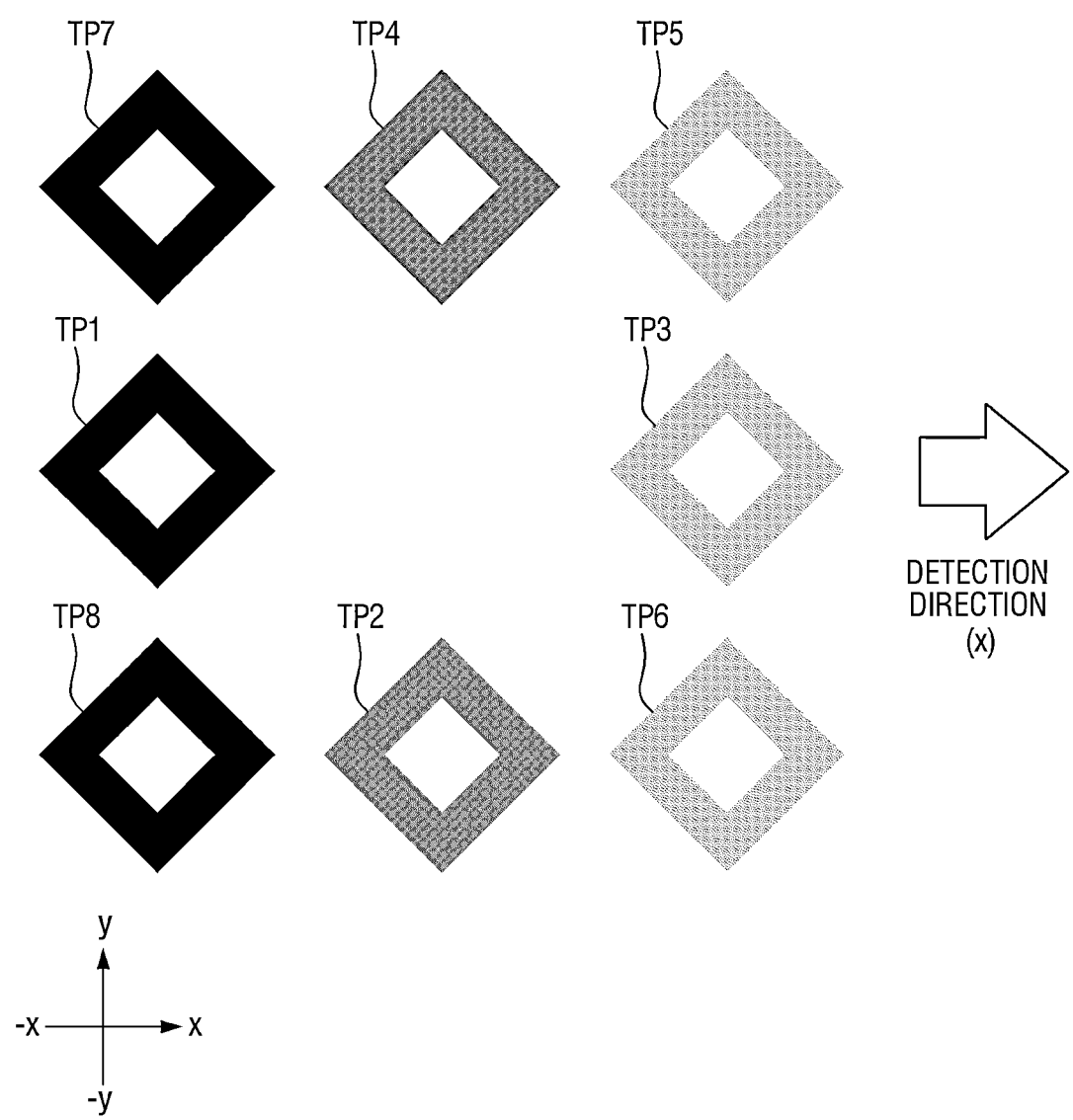
FIG. 28 is a view illustrating detected images, in the x-axis direction, of the tilt sensing patterns illustrated in FIG. 27 according to an embodiment of the present disclosure.

FIG. 28 is a view illustrating detected images, in the x-axis direction, of the tilt sensing patterns illustrated in FIG. 27 according to an embodiment of the present disclosure.

Referring to FIG. 28, the position input device 20 may be disposed with a predetermined tilt in the x-axis direction x to generate detected image data for the code pattern CP and the tilt sensing patterns TIP. In addition, the main processor 500 may distinguish luminance detected image data corresponding to the tilt sensing patterns TIP from the detected image data.

The main processor 500 detects the first to eighth luminance values from the luminance detected images of the first to eighth sensing patterns TP1 to TP8, respectively. The main processor 500 compares and calculates the first to eighth luminance values detected from the luminance detected image of the first to eighth sensing patterns TP1 to TP8 with the first to eighth reference luminance values, respectively.

The main processor 500 detects one sensing pattern detected as having a luminance value that is the highest as compared with the first to eighth reference luminance values among the first to eighth luminance values for the first to eighth sensing patterns TP1 to TP8. In this case, the main processor 500 may determine the arrangement direction of the position input device 20 so as to correspond to an arrangement direction (x-axis direction) of the third sensing pattern TP3 detected as having the luminance value that is the highest.

In addition, the main processor 500 may determine the horizontal tilt of the position input device 20 according to a difference value between any one of the first to eighth reference luminance values and a luminance value that is the highest as compared with any one reference luminance value. For example, the main processor 500 may determine that the horizontal tilt of the position input device 20 becomes greater as a difference value between the third reference luminance value and the third luminance value that is the highest as compared with the third reference luminance value becomes greater, and determine that the horizontal tilt of the position input device 20 becomes smaller as the difference value becomes smaller.

Figure 29:
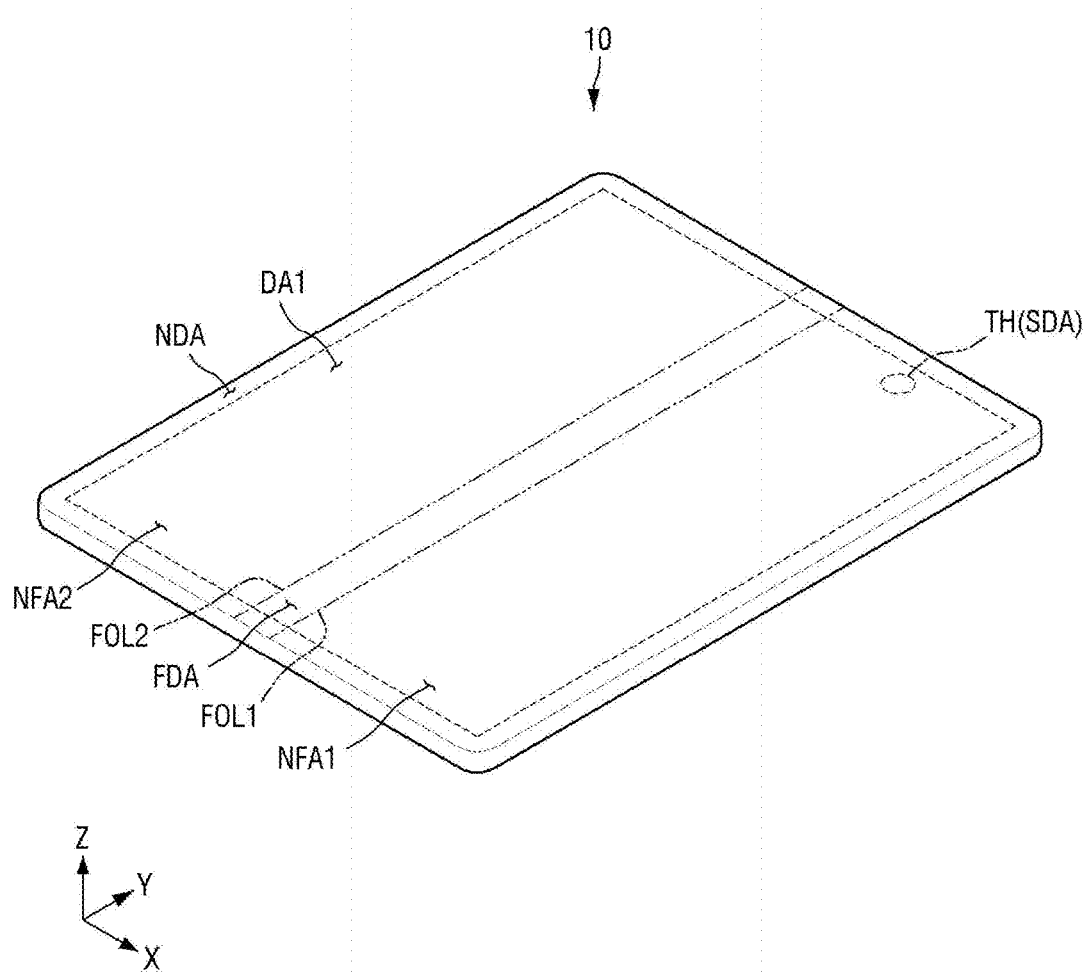
FIGS. 29 and 30 are perspective views illustrating a display device according to an embodiment of the present disclosure.
Figure 30:
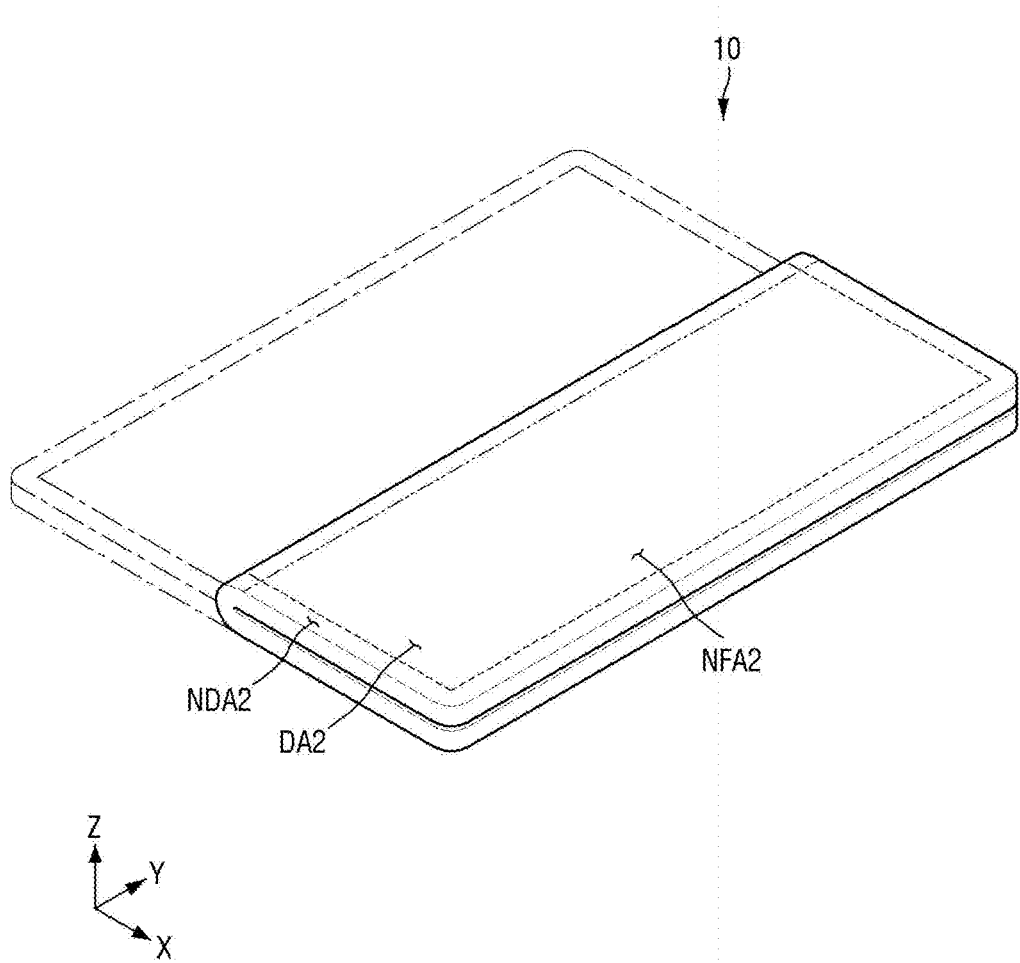

FIGS. 29 and 30 are perspective views illustrating a display device according to an embodiment of the present disclosure.

It has been illustrated in FIGS. 29 and 30 that a display device 10 is a foldable display device foldable in a first direction (X-axis direction). The display device 10 may be maintained in both a folded state and an unfolded state. The display device 10 may be folded in an in-folding manner in which a front surface thereof is disposed inside and not exposed to the user. When the display device 10 is bent or folded in the in-folding manner, front surfaces of the display device 10 may face each other. Alternatively, the display device 10 may be folded in an out-folding manner in which a front surface is disposed outside and is exposed to the user. When the display device 10 is bent or folded in the out-folding manner, rear surfaces of the display device 10 may be disposed to face each other.

A first non-folding area NFA1 may be disposed on one side, for example, the right side of a folding area FDA. A second non-folding area NFA2 may be disposed on the other side, for example, the left side of the folding area FDA. The touch sensing units TSU according to an embodiment of the present disclosure may be formed and disposed in the first non-folding area NFA1 and the second non-folding area NFA2, respectively.

A first folding line FOL1 and a second folding line FOL2 may extend in a second direction (Y-axis direction), and the display device 10 may be folded in the first direction (X-axis direction). Accordingly, a length of the display device 10 in the first direction (X-axis direction) may be reduced by about half, and thus, a user may conveniently carry the display device 10.

In embodiments, an extension direction of the first folding line FOL1 and an extension direction of the second folding line FOL2 are not limited to the second direction (Y-axis direction). For example, the first folding line FOL1 and the second folding line FOL2 may extend in the first direction (X-axis direction), and the display device 10 may be folded in the second direction (Y-axis direction). In this case, a length of the display device 10 in the second direction (Y-axis direction) may be reduced by about half. Alternatively, the first folding line FOL1 and the second folding line FOL2 may extend in a diagonal direction of the display device 10 corresponding to a direction between the first direction (X-axis direction) and the second direction (Y-axis direction). In this case, the display device 10 may be folded in a triangular shape.

When the first folding line FOL1 and the second folding line FOL2 extend in the second direction (Y-axis direction), a length of the folding area FDA in the first direction (X-axis direction) may be shorter than a length of the folding area FDA in the second direction (Y-axis direction). In addition, a length of the first non-folding area NFA1 in the first direction (X-axis direction) may be greater than the length of the folding area FDA in the first direction (X-axis direction). A length of the second non-folding area NFA2 in the first direction (X-axis direction) may be greater than a length of the folding area FDA in the first direction (X-axis direction).

A first display area DA1 may be disposed on a front surface of the display device 10. The first display area DA1 may overlap the folding area FDA, the first non-folding area NFA1, and the second non-folding area NFA2. Therefore, when the display device 10 is unfolded, an image may be displayed in a front surface direction in the folding area FDA, the first non-folding area NFA1, and the second non-folding area NFA2 of the display device 10.

A second display area DA2 may be disposed on a rear surface of the display device 10. The second display area DA2 may overlap the second non-folding area NFA2. Therefore, when the display device 10 is folded, an image may be displayed in a front surface direction in the second non-folding area NFA2 of the display device 10.

It has been illustrated in FIGS. 29 and 30 that a through hole TH in which a component such as, for example, a camera SDA is formed, is disposed in the first non-folding area NFA1, but embodiments of the present disclosure are not limited thereto. For example, in embodiments, the through hole TH or the camera SDA may be disposed in the second non-folding area NFA2 or the folding area FDA.

Figure 31:
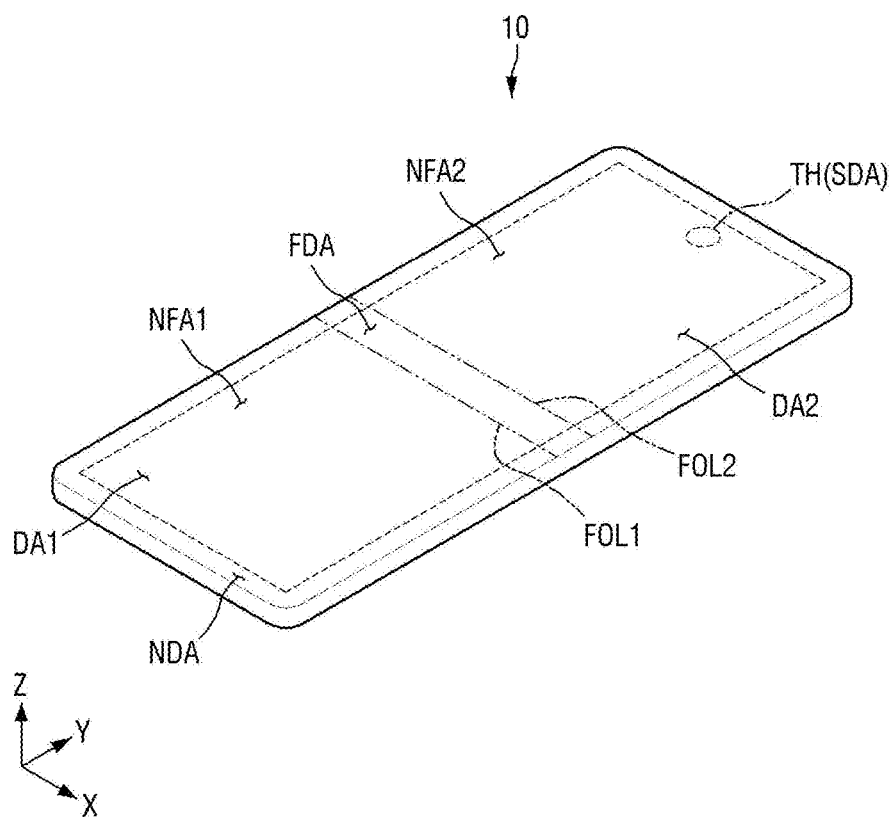
FIGS. 31 and 32 are perspective views illustrating a display device according to an embodiment of the present disclosure.
Figure 32:
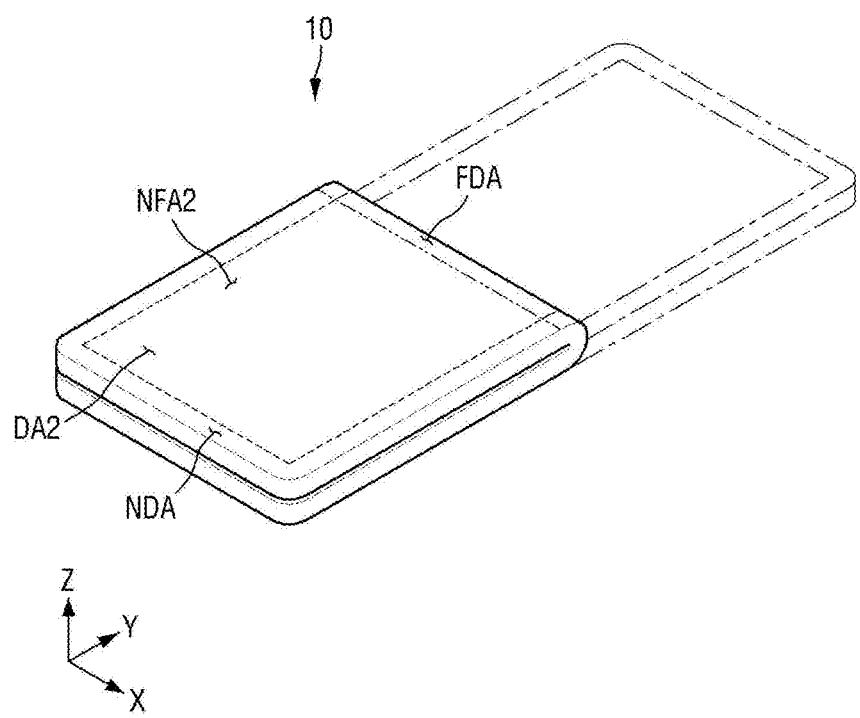

FIGS. 31 and 32 are perspective views illustrating a display device according to an embodiment of the present disclosure.

It has been illustrated in FIGS. 31 and 32 that a display device 10 is a foldable display device foldable in the second direction (Y-axis direction). The display device 10 may be maintained in both a folded state and an unfolded state. The display device 10 may be folded in an in-folding manner in which a front surface thereof is disposed inside. When the display device 10 is bent or folded in the in-folding manner, front surfaces of the display device 10 may be disposed to face each other and are not exposed to the user. Alternatively, the display device 10 may be folded in an out-folding manner in which a front surface is disposed outside. When the display device 10 is bent or folded in the out-folding manner, rear surfaces of the display device 10 may be disposed to face each other and are exposed to the user.

The display device 10 may include a folding area FDA, a first non-folding area NFA1, and a second non-folding area NFA2. The folding area FDA may be an area in which the display device 10 is folded, and the first non-folding area NFA1 and the second non-folding area NFA2 may be areas in which the display device 10 is not folded. The first non-folding area NFA1 may be disposed on one side, for example, the lower side of the folding area FDA. The second non-folding area NFA2 may be disposed on the other side, for example, on the upper side of the folding area FDA.

The touch sensing units TSU according to an embodiment of the present disclosure may be formed and disposed in the first non-folding area NFA1 and the second non-folding area NFA2, respectively.

The folding area FDA may be an area bent with a predetermined curvature in a first folding line FOL1 and a second folding line FOL2. Therefore, the first folding line FOL1 may be a boundary between the folding area FDA and the first non-folding area NFA1, and the second folding line FOL2 may be a boundary between the folding area FDA and the second non-folding area NFA2.

The first folding line FOL1 and the second folding line FOL2 may extend in the first direction (X-axis direction) as illustrated in FIGS. 31 and 32, and the display device 10 may be folded in the second direction (Y-axis direction). Accordingly, a length of the display device 10 in the second direction (Y-axis direction) may be reduced by about half, and thus, a user may conveniently carry the display device 10.

In embodiments, an extension direction of the first folding line FOL1 and an extension direction of the second folding line FOL2 are not limited to the first direction (X-axis direction). For example, the first folding line FOL1 and the second folding line FOL2 may extend in the second direction (Y-axis direction), and the display device 10 may be folded in the first direction (X-axis direction). In this case, a length of the display device 10 in the first direction (X-axis direction) may be reduced by about half. Alternatively, the first folding line FOL1 and the second folding line FOL2 may extend in a diagonal direction of the display device 10 corresponding to a direction between the first direction (X-axis direction) and the second direction (Y-axis direction). In this case, the display device 10 may be folded in a triangular shape.

When the first folding line FOL1 and the second folding line FOL2 extend in the first direction (X-axis direction) as illustrated in FIGS. 31 and 32, a length of the folding area FDA in the second direction (Y-axis direction) may be shorter than a length of the folding area FDA in the first direction (X-axis direction). In addition, a length of the first non-folding area NFA1 in the second direction (Y-axis direction) may be greater than the length of the folding area FDA in the second direction (Y-axis direction). A length of the second non-folding area NFA2 in the second direction (Y-axis direction) may be greater than the length of the folding area FDA in the second direction (Y-axis direction).

A first display area DA1 may be disposed on a front surface of the display device 10. The first display area DA1 may overlap the folding area FDA, the first non-folding area NFA1, and the second non-folding area NFA2. Therefore, when the display device 10 is unfolded, an image may be displayed in a front surface direction in the folding area FDA, the first non-folding area NFA1, and the second non-folding area NFA2 of the display device 10.

A second display area DA2 may be disposed on a rear surface of the display device 10. The second display area DA2 may overlap the second non-folding area NFA2. Therefore, when the display device 10 is folded, an image may be displayed in a front surface direction in the second non-folding area NFA2 of the display device 10.

It has been illustrated in FIGS. 31 and 32 that a through hole TH in which a component such as, for example, a camera SDA, is disposed in the second non-folding area NFA2, but embodiments of the present disclosure are not limited thereto. For example, in embodiments, the through hole TH may be disposed in the first non-folding area NFA1 or the folding area FDA.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A display device, comprising:
a display unit comprising a plurality of emission areas;
a plurality of touch electrodes that sense a touch;
a plurality of code patterns formed in a preset code shape on partial areas of front surfaces of the plurality of touch electrodes;
a plurality of tilt sensing patterns, including first to fourth tilt sensing patterns, comprising a light absorbent disposed in an inner area or a peripheral area of each of the plurality of code patterns; and
a main processor that
receives detected image data corresponding to the plurality of tilt sensing patterns from a position input device, and determines arrangement direction information and tilt information of the position input device by comparing the detected image data with each other,
distinguishes a detected image of each of the first to fourth sensing patterns from the detected image data and calculates light amount detected areas sensed differently according to amounts of reflected light from the detected image of each of the first to fourth sensing patterns, and
sets the detected images and the light amount detected areas of the first to fourth sensing patterns detected at a preset reference distance of a front surface of a display panel as reference detected images and reference detected areas.

2. The display device of claim 1, wherein the plurality of tilt sensing patterns are respectively disposed around each of the plurality of code patterns in a horizontal direction (−x-axis direction) of a first side and an upward direction (y-axis direction) of a second side of each of the plurality of code patterns, or are respectively disposed around each of the plurality of code patterns in horizontal directions (x-axis and −x-axis directions) of the first side and an opposing third side and upward and downward directions (y-axis and −y-axis directions) of the second side and an opposing fourth side of each of the plurality of code patterns, in a plan view.

3. The display device of claim 2, wherein, in a plan view, the plurality of tilt sensing patterns are formed in any one of at least one closed loop shape of a rectangular shape, a square shape, a circular shape, and a rhombic shape,
an open loop shape in which the plurality of tilt sensing patterns partially surround at least one of the plurality of emission areas,
a mesh shape in which the plurality of tilt sensing patterns surround both portions between and circumferences of the plurality of emission areas, and
a linear shape having a preset length.

4. The display device of claim 2, wherein the main processor
detects light amount detected areas or sensed luminance values corresponding to a plurality of tilt sensing pattern images through the detected image data corresponding to the plurality of tilt sensing patterns,
generates a comparison result by comparing the light amount detected areas or the sensed luminance values corresponding to the plurality of tilt sensing patterns with each other, and
determines the arrangement direction information and the tilt information of the position input device according to the comparison result.

5. The display device of claim 1, wherein:
the first sensing pattern is disposed in a horizontal direction (−x-axis direction) of a first side of each of the plurality of code patterns;
the second sensing pattern is disposed in an upward direction (y-axis direction) of a second side of each of the plurality of code patterns;
the third sensing pattern is disposed in a downward direction (−y-axis direction) of a fourth side, which opposes the second side, of each of the plurality of code patterns; and
the fourth sensing pattern is disposed in a horizontal direction (x-axis direction) of a third side, which opposes the first side, of each of the plurality of code patterns.

6. The display device of claim 5, wherein the first to fourth sensing patterns are formed by patterning a light blocking member including the light absorbent, and
a content of the light absorbent included in the light blocking member is highest in any one side direction and gradually decreases from the any one side direction to another side direction opposite to the any one side direction.

7. The display device of claim 5, wherein the main processor distinguishes a detected image of each of the first to fourth sensing patterns from the detected image data, and corrects a size of the detected image of each of the first to fourth sensing patterns by increasing or decreasing the size according to a distance between the display unit and the position input device.

8. The display device of claim 1, wherein when detected images and light amount detected areas of the first to fourth sensing patterns detected at a first time are the same as the reference detected images and the reference detected areas, or are similar to the reference detected images and the reference detected areas within reference error ranges, the main processor determines an arrangement direction of the position input device as a front surface direction and a tilt of the position input device as being substantially perpendicular to the front surface direction.

9. The display device of claim 1, wherein the main processor
detects one sensing pattern calculated as having a greatest light amount detected area among the first to fourth sensing patterns by comparing the calculated light amount detected areas of the first to fourth sensing patterns with each other, and
the arrangement direction information of the position input device determined by the main processor corresponds to an arrangement direction of the one sensing pattern calculated as having the greatest light amount detected area.

10. The display device of claim 9, wherein the main processor determines that a horizontal tilt of the position input device becomes greater or smaller as an area of the sensing pattern calculated as having the greatest light amount detected area becomes greater or smaller.

11. A display device, comprising:
a display unit comprising a plurality of emission areas;
a plurality of touch electrodes that sense a touch;
a plurality of code patterns formed in a preset code shape on partial areas of front surfaces of the plurality of touch electrodes;
a plurality of tilt sensing patterns comprising a light absorbent disposed in an inner area or a peripheral area of each of the plurality of code patterns; and
a main processor that receives detected image data corresponding to the plurality of tilt sensing patterns from a position input device, and determines arrangement direction information and tilt information of the position input device by comparing the detected image data with each other,
wherein the plurality of sensing patterns are formed by patterning a light blocking member including the light absorbent, and
the plurality of tilt sensing patterns comprise:
a first sensing pattern in which a content of the light absorbent included in the light blocking member is about 25%;
a second sensing pattern in which a content of the light absorbent included in the light blocking member is about 50%;
a third sensing pattern in which a content of the light absorbent included in the light blocking member is about 75%; and
a fourth sensing pattern in which a content of the light absorbent included in the light blocking member is about 100%.

12. The display device of claim 11, wherein the plurality of tilt sensing patterns further comprise:
a fifth sensing pattern in which a content of the light absorbent included in the light blocking member is about 25%;
a sixth sensing pattern in which a content of the light absorbent included in the light blocking member is about 50%;
a seventh sensing pattern in which a content of the light absorbent included in the light blocking member is about 75%; and
an eighth sensing pattern in which a content of the light absorbent included in the light blocking member is about 100%.

13. The display device of claim 11, wherein the main processor detects luminance detected images and first to fourth luminance values of the first to fourth sensing patterns from the detected image data detected in a front surface direction, and
- sets the luminance detected images and the first to fourth luminance values of the first to fourth sensing patterns detected in the front surface direction as reference luminance detected images and first to fourth reference luminance values.

14. The display device of claim 13, wherein when the first to fourth luminance values of the first to fourth sensing patterns detected at a first time are the same as the first to fourth reference luminance values or similar to the first to fourth reference luminance values within reference error ranges, the main processor determines an arrangement direction of the position input device as a front surface direction and a tilt of the position input device as being substantially perpendicular to the front surface direction.

15. The display device of claim 13, wherein the main processor detects the first to fourth luminance values from the luminance detected images of the first to fourth sensing patterns detected at a first time,
- detects one sensing pattern as having a highest luminance value among the first to fourth luminance values by comparing the first to fourth luminance values with the first to fourth reference luminance values, respectively, and
- determines an arrangement direction of the position input device so as to correspond to an arrangement direction of the one sensing pattern detected as having the highest luminance value.

16. The display device of claim 13, wherein the main processor determines that a horizontal tilt of the position input device becomes greater or smaller as a difference value between any one of the first to fourth reference luminance values and a highest luminance value among the first to fourth luminance values becomes greater or smaller.

17. A touch input system, comprising:
- a display device that displays an image; and
- a position input device that inputs touch coordinates to the display device,
- wherein the display device comprises:
- a display unit comprising a plurality of emission areas;
- a plurality of touch electrodes that sense a touch;
- a plurality of code patterns formed in a preset code shape on partial areas of front surfaces of the plurality of touch electrodes; and
- a plurality of tilt sensing patterns comprising a light absorbent disposed in an inner area or a peripheral area of each of the plurality of code patterns,
- wherein the position input device comprises a code processor that generates detected image data corresponding to the plurality of tilt sensing patterns, and generates arrangement direction information of the position input device and tilt information of the position input device by comparing the detected image data corresponding to the plurality of tilt sensing patterns with each other,
- wherein the plurality of sensing patterns are formed by patterning a light blocking member including the light absorbent, and
- the plurality of tilt sensing patterns comprise:
- a first sensing pattern in which a content of the light absorbent included in the light blocking member is about 25%;
- a second sensing pattern in which a content of the light absorbent included in the light blocking member is about 50%;
- a third sensing pattern in which a content of the light absorbent included in the light blocking member is about 75%; and
- a fourth sensing pattern in which a content of the light absorbent included in the light blocking member is about 100%.

18. The touch input system of claim 17, wherein the code processor
- detects light amount detected areas or sensed luminance values corresponding to a plurality of tilt sensing pattern images through the detected image data corresponding to the plurality of tilt sensing patterns,
- generates a comparison result by comparing the light amount detected areas or the sensed luminance values corresponding to the plurality of tilt sensing patterns with each other, and
- determines the arrangement direction information and the tilt information of the position input device according to the comparison result.

* * * * *